(12) United States Patent
Oh et al.

(10) Patent No.: US 11,990,566 B2
(45) Date of Patent: May 21, 2024

(54) DISPLAY DEVICE

(71) Applicant: Samsung Display Co., Ltd., Yongin-si (KR)

(72) Inventors: Won Sik Oh, Hwaseong-si (KR); Sin Chul Kang, Hwaseong-si (KR); Dae Hyun Kim, Hwaseong-si (KR); Hyun Min Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 592 days.

(21) Appl. No.: 17/260,944

(22) PCT Filed: Dec. 13, 2018

(86) PCT No.: PCT/KR2018/015859
§ 371 (c)(1),
(2) Date: Jan. 15, 2021

(87) PCT Pub. No.: WO2020/017712
PCT Pub. Date: Jan. 23, 2020

(65) Prior Publication Data
US 2021/0288220 A1 Sep. 16, 2021

(30) Foreign Application Priority Data
Jul. 19, 2018 (KR) .......................... 10-2018-0084255

(51) Int. Cl.
*H01L 33/38* (2010.01)
*H01L 27/15* (2006.01)
*H01L 33/62* (2010.01)

(52) U.S. Cl.
CPC .......... *H01L 33/382* (2013.01); *H01L 27/156* (2013.01); *H01L 33/62* (2013.01)

(58) Field of Classification Search
CPC .......... H01L 33/38–382; H01L 33/385; H01L 33/387; H01L 25/0753; H01L 25/124; G06F 3/0448
See application file for complete search history.

(56) References Cited

U.S. PATENT DOCUMENTS 8,994,620 B2    3/2015  Toya
9,590,139 B1 *  3/2017  Lai .......................... H01L 33/06
(Continued)

FOREIGN PATENT DOCUMENTS

CN    107256877 A    10/2017
CN    107623013       1/2018
(Continued)

OTHER PUBLICATIONS

International Search Report for corresponding International Application No. PCT/KR2018/015859, dated Apr. 18, 2019, 4pp.
(Continued)

*Primary Examiner* — Wasiul Haider
(74) *Attorney, Agent, or Firm* — Lewis Roca Rothgerber Christie LLP

(57) ABSTRACT

A display device includes a first electrode stem and a second electrode stem extended in a first direction and spaced from each other, a first electrode branch branching off from the first electrode stem and extended in a second direction, a second electrode branch branching off from the second electrode stem and extended in the second direction, a third electrode between the first electrode branch and the second electrode branch and one or more light-emitting elements between the first electrode branch and the third electrode and between the third electrode and the second electrode branch, wherein the third electrode is extended in the second direction, and both ends of the third electrode in the second (Continued)

direction are spaced from the first electrode stem and from the second electrode stem, respectively.

15 Claims, 23 Drawing Sheets

(56) References Cited

U.S. PATENT DOCUMENTS

| | | | |
|---|---|---|---|
| 10,211,418 B2 | 2/2019 | Im et al. | |
| 10,714,701 B2 | 7/2020 | Im et al. | |
| 11,127,914 B2 | 9/2021 | Im et al. | |
| 2008/0251381 A1 | 10/2008 | Shibata et al. | |
| 2011/0089850 A1 | 4/2011 | Shibata et al. | |
| 2011/0254043 A1 | 10/2011 | Negishi et al. | |
| 2011/0316009 A1 | 12/2011 | Fukasawa | |
| 2014/0145237 A1 | 5/2014 | Do et al. | |
| 2015/0154915 A1 | 6/2015 | Toya | |
| 2017/0200866 A1* | 7/2017 | Wu | H01L 33/58 |
| 2018/0019369 A1 | 1/2018 | Cho et al. | |
| 2018/0019426 A1 | 1/2018 | Im et al. | |
| 2018/0138157 A1 | 5/2018 | Im et al. | |
| 2018/0175009 A1 | 6/2018 | Kim et al. | |
| 2018/0175106 A1 | 6/2018 | Kim et al. | |
| 2018/0198018 A1 | 7/2018 | Kim et al. | |
| 2018/0211582 A1 | 7/2018 | Sakariya et al. | |
| 2019/0013298 A1* | 1/2019 | Lai | H01L 25/0753 |
| 2019/0157512 A1* | 5/2019 | Jung | H01L 25/167 |
| 2019/0296200 A1 | 9/2019 | Im et al. | |
| 2020/0090574 A1 | 3/2020 | Sakariya et al. | |
| 2020/0203583 A1 | 6/2020 | Im et al. | |
| 2021/0193885 A1 | 6/2021 | Im et al. | |
| 2021/0366349 A1 | 11/2021 | Sakariya et al. | |

FOREIGN PATENT DOCUMENTS

| | | |
|---|---|---|
| JP | 2012-009622 | 1/2012 |
| JP | 2018-518711 | 7/2018 |
| KR | 10-2012-0122159 A | 11/2012 |
| KR | 10-1436123 B1 | 11/2014 |
| KR | 10-2015-0006798 A | 1/2015 |
| KR | 10-2016-0059574 A | 5/2016 |
| KR | 10-2018-0007376 A | 1/2018 |
| KR | 10-2018-0009015 A | 1/2018 |
| KR | 10-2018-0009116 A | 1/2018 |
| KR | 10-2018-0033927 A | 4/2018 |
| KR | 2018-0055021 | 5/2018 |
| KR | 10-2018-0059801 A | 6/2018 |
| KR | 10-2018-0072909 A | 7/2018 |
| TW | 201721617 | 6/2017 |

OTHER PUBLICATIONS

Chinese Office Action dated Jan. 18, 2024 regarding Chinese Patent Application No. 201880095677.4 corresponding to U.S. Appl. No. 17/260,944 (9 pages).

* cited by examiner

DISPLAY DEVICE

CROSS-REFERENCE TO RELATED APPLICATIONS

This application is a National Phase Patent Application and claims priority to and the benefit of International Application Number PCT/KR2018/015859, filed on Dec. 13, 2018, which claims priority to Korean Patent Application Number 10-2018-0084255, filed on Jul. 19, 2018, the entire contents of all of which are incorporated herein by reference.

TECHNICAL FIELD

The present disclosure relates to a display device, and more particularly, to a display device including an array of inorganic light-emitting diodes.

BACKGROUND ART

Display devices become more and more important as multimedia technology evolves. Accordingly, a variety of types of display devices such as organic light-emitting display (OLED) devices and liquid-crystal display (LCD) devices are currently used.

Display devices are for displaying images and include a display panel such as an organic light-emitting display panel or a liquid-crystal display panel. Among them, light-emitting display panels may include light-emitting elements. For example, light-emitting diodes (LEDs) may include an organic light-emitting diode (OLED) using an organic material as a fluorescent material, and an inorganic light-emitting diode using an inorganic material as a fluorescent material.

An organic light-emitting diode (OLED) uses an organic material as the fluorescent material of the light-emitting elements. It is desirable that the fabricating process is simple and the element has flexibility. However, it is known that the organic materials are vulnerable to high-temperature driving environments and the efficiency of blue light is relatively low.

In contrast, an inorganic light-emitting diode uses an inorganic semiconductor as the fluorescent material and is desirable that it has durability in high-temperature environments and that it has a higher efficiency of blue light than organic light-emitting diodes. Previously, the process of fabricating inorganic light-emitting diodes had its shortcomings. However, a transfer method using dielectrophoresis (DEP) has been developed, and thus the shortcoming has been overcome. Therefore, researches on inorganic light-emitting diodes are ongoing because they have better durability and efficiency compared to the organic light-emitting diodes.

DISCLOSURE

Technical Problem

Aspects of the present disclosure provide a display device in which light-emitting elements are connected in series, so that the capacity of driving transistors can be reduced, and the voltage-dividing efficiency and the power loss due to the line resistance can be improved.

Additional advantages, subjects, and features of the invention will be set forth in part in the description which follows and in part will become apparent to those having ordinary skill in the art upon examination of the following or may be learned from practice of the invention.

Technical Solution

According to an aspect of the present disclosure, a display device includes a first electrode stem and a second electrode stem extended in a first direction and spaced from each other, a first electrode branch branching off from the first electrode stem and extended in a second direction, a second electrode branch branching off from the second electrode stem and extended in the second direction, a third electrode located between the first electrode branch and the second electrode branch and one or more light-emitting elements located between the first electrode branch and the third electrode and between the third electrode and the second electrode branch, wherein the third electrode is extended in the second direction, and both ends of the third electrode in the second direction are spaced from the first electrode stem and from the second electrode stem, respectively.

The first electrode branch may be extended opposite to the second electrode branch in the second direction.

The light-emitting elements may include a first light-emitting element located between the first electrode branch and the third electrode and a second light-emitting element located between the third electrode and the second electrode branch, wherein the first light-emitting element and the second light-emitting element may be connected in series between the first electrode branch and the second electrode branch.

A first end of the first light-emitting element may be connected to the first electrode branch and a second end of the first light-emitting element may be connected to the third electrode, wherein the first end or the second end of the first light-emitting element may include a p-type semiconductor layer and the second end or the first end of the first light-emitting element may include an n-type semiconductor layer, and wherein the first light-emitting element may include an active layer between the p-type semiconductor layer and the n-type semiconductor layer.

The display device may include a plurality of first electrode branches branching off from the first electrode branch, and the second electrode branch may be between the plurality of first electrode branches.

The third electrode may be located at least between the second electrode branch and the first electrode branch located on one side of the second electrode branch, and between the second electrode branch and the first electrode branch located on an opposite side of the second electrode branch.

The display device may include two or more third electrodes, and wherein the light-emitting elements may be between adjacent ones of the third electrodes.

The light-emitting elements may include a third light-emitting element electrically connected on the one side of the second electrode branch and a fourth light-emitting element electrically connected on the opposite side of the second electrode branch, wherein the third light-emitting element and the fourth light-emitting element may be connected in parallel between the one side and the opposite side of the second electrode branch.

The plurality of first electrode branches and the two or more third electrodes may be symmetrically arranged with respect to the second electrode branch.

The third electrode may include a third electrode fragment protruding from the first electrode stem and the second electrode stem in the second direction and a third electrode branch spaced from the third electrode fragment, the third electrode branch extending from the third electrode fragment.

The third electrode may include two or more third electrode branches spaced from each other between the first electrode branch and the second electrode branch, and wherein the light-emitting elements may include a fifth light-emitting element having an end electrically connected to the first electrode stem and another end connected to the third electrode branch, a sixth light-emitting element having both ends electrically connected to the two or more third electrode branches and a seventh light-emitting element having one end electrically connected to the third electrode branch and another end connected to the second electrode branch, wherein the fifth light-emitting element, the sixth light-emitting element and the seventh light-emitting element may be connected in series between the first electrode branch and the second electrode branch.

According to another aspect of the present disclosure, a display device includes a first electrode stem and a second electrode line extended in a first direction and spaced from each other, a first electrode branch branching off from the first electrode stem and extended in a second direction, a second electrode branch spaced from the first electrode branch and extended in the second direction, the second electrode branch being terminated while spaced from the first electrode stem, a third electrode located between the first electrode branch and the second electrode branch and extended in the second direction, both ends of the third electrode being terminated while spaced from the first electrode stem and the second electrode line and one or more light-emitting elements located among the first electrode branch, the second electrode branch and the third electrode, wherein the second electrode branch is electrically connected to the second electrode line.

The first electrode stem and the second electrode line may be located at different line layers, and wherein the second electrode branch may be electrically connected to the second electrode line through a contact hole.

The first electrode stem may further include a second electrode fragment protruding from the first electrode stem in the second direction.

The second electrode fragment may be extended in the second direction and is aligned with the second electrode branch.

The first electrode stem may be electrically connected to a thin-film transistor, wherein the second electrode line is electrically connected to a common power supply line, wherein the light-emitting elements may include a first light-emitting element located between the first electrode branch and the third electrode, and a second light-emitting element located between the third electrode and the second electrode branch, and wherein the first light-emitting element and the second light-emitting element may be connected in series between the first electrode branch and the second electrode branch.

According to the other aspect of the present disclosure, a display device includes a first electrode connected to a thin-film transistor, a second electrode connected to a common power supply line, a floating electrode between the first electrode and the second electrode, a first light-emitting diode having one end electrically connected to the first electrode and another end electrically connected to the floating electrode and a second light-emitting diode having one end electrically connected to the floating electrode and another end electrically connected to the second electrode, wherein the first light-emitting diode and the second light-emitting diode are connected in series between the first electrode and the second electrode.

The first electrode, the second electrode and the floating electrode may be extended in a first direction, and wherein the first light-emitting diode and the second light-emitting diode in series may be extended in a second direction.

The first light-emitting diode and the second light-emitting diode each may include a first conductivity-type semiconductor layer, an active layer, and a second conductivity-type semiconductor layer, wherein one of the first conductivity-type semiconductor layer and the second conductivity-type semiconductor layer may be of p-type and other one may be of n-type, and wherein the first conductivity-type semiconductor layer of the first light-emitting diode may be electrically connected to the first electrode, and the second conductivity-type semiconductor layer of the first light-emitting diode may be electrically connected to the floating electrode, the first conductivity-type semiconductor layer of the second light-emitting diode may be electrically connected to the floating electrode, and the second conductivity-type semiconductor layer of the second light-emitting diode may be electrically connected to the second electrode.

The length of the first light-emitting diode and the second light-emitting diode may range from 3 μm to 6 μm.

The details of other embodiments are included in the detailed description and the drawings.

According to an exemplary embodiment of the present disclosure, a display device includes a floating electrode between a first electrode and a second electrode, so that light-emitting elements electrically connected between the electrodes can be connected in series between the first electrode and the second electrode. Accordingly, during the process of fabricating display devices, it is easier to design the capacity of driving thin-film transistors, and it is possible to improve voltage-dividing efficiency and power loss due to line resistance.

Advantageous effects according to the present disclosure are not limited to those mentioned above, and various other advantageous effects are included herein.

MODES OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, exemplary embodiments of the present disclosure will be described with reference to the accompanying drawings.

Figure 1:
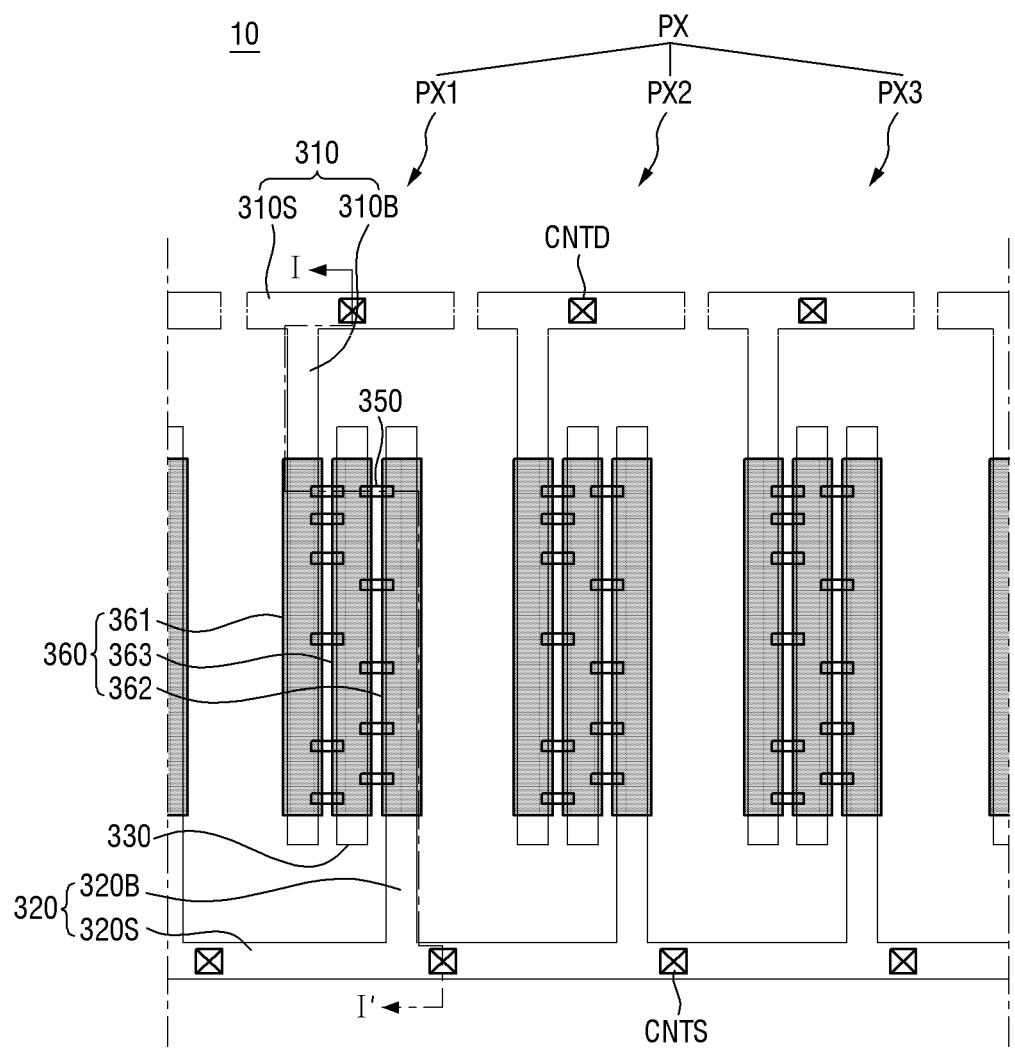
FIG. 1 is a plan view of a display device according to an exemplary embodiment of the present disclosure.

FIG. 1 is a plan view of a display device according to an exemplary embodiment of the present disclosure.

The display device 10 may include one or more regions defined as pixels PX (e.g., one of pixels PX1, PX2, PX3). The plurality of pixels PX may be disposed on a display part of the display device 10 so that light of a particular wavelength band can exit the display device 10. Although three pixels PX1, PX2 and PX3 are depicted in FIG. 1 by way of example, it is to be understood that the display device 10 may include more pixels. Although the cross-sectional view of FIG. 1 shows the pixels PX arranged only along one direction, i.e., a first direction D1, the pixels PX may be arranged along a second direction D2 intersecting with the first direction D1 as well. In addition, the pixels PX shown in FIG. 1 may be divided into a plurality of sub-pixels, each of which may form a pixel PX (e.g., one of pixels PX1, PX2, PX3). The pixels may not be necessarily arranged along parallel as shown in FIG. 1 but may be arranged in a variety of ways, e.g., in the vertical direction (or the second direction), in a zigzag pattern, etc.

Although not shown in the drawings, the display device 10 may include an emission portion in which the light-emitting elements 350 are disposed to emit light of a color, and a non-emission portion that is defined as the region other than the emission portion. The non-emission portion may be covered by some members so that it is not visible from outside the display device 10. In the non-emission portion, a variety of elements for driving the light-emitting elements 350 disposed in the emission portion are located. For example, in the non-emission portion, lines for applying electrical signals to the emission portion, circuits, drivers, etc., may be disposed. It is, however, to be understood that the present disclosure is not limited thereto.

Each of the plurality of pixels PX may include one or more light-emitting elements 350 that emit light of particular wavelength bands to represent colors. The light emitted from the light-emitting elements 350 can be seen outside the display device 10 via the emission portion. In an exemplary embodiment, pixels PX that represent different colors may include light-emitting elements 350 that emit different colors. For example, a first pixel PX1 for representing red may include a light-emitting element 350 for emitting red light, a second pixel PX2 for representing green may include a light-emitting element 350 for emitting green light, and a third pixel PX3 for representing blue may include a light-emitting element 350 for emitting blue light. It is, however, to be understood that the present disclosure is not limited thereto. In some implementations, the pixels representing different colors may include the light-emitting elements 350 for emitting the same color (e.g., blue), and a wavelength conversion layer or a color filter may be located on in the emission path to represent colors of the pixels. It is, however, to be understood that the present disclosure is not limited thereto. In some implementations, adjacent pixels PX may emit light of the same color.

Referring to FIG. 1, the display device 10 may include a plurality of electrodes 310, 320 and 330 and a plurality of light-emitting elements 350. At least some of the electrodes 310, 320 and 330 may be disposed in each of the pixels PX and may be electrically connected to the light-emitting elements 350 to apply electrical signals so that the light-emitting elements 350 can represent a particular color.

In addition, at least some of the electrodes 310, 320 and 330 may be utilized to form an electric field within the pixel PX to align the light-emitting elements 350. Specifically, when the light-emitting elements 350 that emit different colors are aligned in the plurality of pixels PX, it is necessary to accurately align the different light-emitting elements 350 for each of the pixels PX. The light-emitting elements 350 may be aligned using the dielectrophoresis as follows: a solution containing the light-emitting elements 350 is applied onto the display device 10, and an AC electric power is applied to it to form an electric field, and a dielectrophoresis force is applied to the light-emitting elements 350 to align them.

The plurality of electrodes 310, 320 and 330 may include a first electrode 310, a second electrode 320, and a third electrode 330. In an exemplary embodiment, the first electrode 310 may be disconnected from pixel to pixel PX, while the second electrode 320 may be a common electrode connected across the plurality of pixels PX. The first electrode 310 may be an anode electrode of the light-emitting elements 350, while the second electrode 320 may be a cathode electrode of the light-emitting elements 350. It is, however, to be understood that the present disclosure is not limited thereto. That is to say, the first electrode 310 may be a cathode electrode of the light-emitting elements 350, while the second electrode 320 may be an anode electrode of the light-emitting elements 350.

The first electrode 310 and the second electrode 320 may include electrode stems 310S and 320S extended in the first direction D1, respectively, and one or more electrode branches 310B and 320B branching off from the electrode stems 310S and 320S, respectively, and extended in a second direction D2 intersecting the first direction D1.

Specifically, the first electrode 310 may include a first electrode stem 310S extended in the first direction D1, and at least one first electrode branch 310B branching off from the electrode stem 310S, and extended in the second direction D2. Although not shown in the drawings, one end of the first electrode stem 310S may be connected to a signal application pad, the other end thereof may be extended in the first direction D1 and electrically disconnected from pixel to pixel PX. The signal application pad may be connected to the display device 10 or an external power source to apply an electrical signal to the first electrode stem 310S or to apply an AC power to align the light-emitting elements 350.

A first electrode stem 310S of a pixel may be substantially in line with a first electrode stem 310S of a pixel adjacent to the pixel in the same row (e.g., in the first direction D1). In other words, both ends of the first electrode stem 310S of a pixel are terminated between the pixel and an adjacent pixel PX and separated from it, and the first electrode stem 310S of the adjacent pixel may be in line with the first electrode stem 310S of the pixel. The first electrode stem 310S may be formed as a single stem electrode during the fabrication process, and then may be cut using a laser or the like after the light-emitting elements 350 are aligned. Accordingly, the first electrode stem 310S disposed in each of the pixels PX may apply different electrical signals to different electrode branches 310B, such that the first electrode branches 310B may be driven individually.

The first electrode branch 310B may branch off from at least a portion of the first electrode stem 310S to be extended in the second direction D2 and may be terminated while being spaced apart from the second electrode stem 320S that is located opposite to the first electrode stem 310S. That is to say, in a pixel PX, an end of the first electrode branch 310B may be connected to the first electrode stem 310S, and the other end of the first electrode branch 310B may be spaced apart from the second electrode stem 320S. Because the first electrode branch 310B is connected to the first electrode stem 310S that is electrically separated from pixel to pixel, different pixels PX can receive different electrical signals.

In addition, the first electrode branch 310B may be spaced apart from the second electrode branch 320B and the third electrode 330 to be described later. Although only one first electrode branch 310B is shown in FIG. 1, more than one first electrode branches 310B may be provided. In such a case, some of the first electrode branches 310B may be electrically separated from the first electrode stem 310S to form the third electrode 330 to be described later. A more detailed description thereon will be given below.

The second electrode 320 may include a second electrode stem 320S extended in the first direction D1 and spaced apart from and located opposite to the first electrode stem 310S, at least one second electrode branch 320B branching off from the second electrode stem 320S and extended in the second direction D2 and spaced apart from and facing the first electrode branch 310B. Like the first electrode stem 310S, an end of the second electrode stem 320S may be connected to the signal application pad. It is to be noted that the other end of the second electrode stem 320S may be extended across the plurality of pixels PX adjacent to one another in the first direction D1. That is to say, the second electrode stem 320S may be electrically connected between the pixels PX. Accordingly, both ends of the second electrode stem 320S in a pixel are connected to ends of adjacent pixels on either sides, so that the same electrical signal can be applied to the pixels.

The second electrode branch 320B may branch off from at least a portion of the second electrode stem 320S to be extended in the second direction D2 and may be terminated while being spaced apart from the first electrode stem 310S. That is to say, in a pixel PX, an end of the second electrode branch 320B may be connected to the second electrode stem 320S, and the other end of the second electrode branch 320B may be spaced apart from the first electrode stem 310S. Because the second electrode branch 320B is connected to the second electrode stem 320S that is electrically connected from pixel to pixel, different pixels PX can receive the same electrical signal.

In addition, the second electrode branch 320B may be spaced apart from the first electrode branch 310B and the third electrode 330. Because the first electrode stem 310S and the second electrode stem 320S are spaced apart from and located opposite to each other on opposite sides of the center of each pixel PX, the first electrode branch 310B and the second electrode branch 320B may be extended in opposite directions. In other words, the first electrode branch 310B may be extended toward a side in the second direction D2 and the second electrode branch 320B may be extended toward the opposite side in the second direction D2, such that they may be disposed on the opposite sides with respect to the center of the pixel PX. It is, however, to be understood that the present disclosure is not limited thereto. The first electrode stem 310S and the second electrode stem 320S may be disposed on the same side of the center of the pixel PX and may be spaced apart from each other. In such a case, the first electrode branch 310B and the second electrode branch 320B branching off from the electrode stems 310S and 320S, respectively, may be extended in the same direction.

Although only one first electrode branch 320B is shown in FIG. 1, more than one first electrode branches 310B may be provided. In such a case, like the first electrode branches 310B, some of the second electrode branches 320B may be electrically separated from the second electrode stem 320S to form the third electrode 330 to be described later.

At least one third electrode 330 may be disposed between the first electrode branch 310B and the second electrode branch 320B. The third electrode 330 may have substantially the same shape as the first electrode branch 310B or the second electrode branch 320B and face them. The third electrode 330 may be extended in the second direction D2, and both ends thereof may be terminated such that they are spaced apart from the first electrode stem 310S and the second electrode stem 320S in the second direction D2. That is to say, the third electrode 330 may be electrically separated from the electrode stems 310S and 320S. In an exemplary embodiment, the third electrode 330 may be a floating electrode to which no electrical signal is directly applied from the electrode stems 310S and 320S. It is, however, to be understood that the present disclosure is not limited thereto.

The third electrode 330 may be equally spaced apart from the first electrode branch 310B and the second electrode branch 320B. That is to say, the third electrode 330 may have a constant width between the first electrode branch 310B and the second electrode branch 320B. The light-emitting elements 350 described later are arranged between the first electrode branch 310B and the third electrode 330 and between the third electrode 330 and the second electrode branch 320B. The third electrode 330 may be spaced apart at a constant spacing so that the light-emitting elements 350 may be connected to the first electrode branch 310B or the second electrode branch 320B and the third electrode 330. It is, however, to be understood that the present disclosure is not limited thereto. When the length of the third electrode 330 measured in the first direction D1 is sufficiently long, the third electrode 330 may not necessarily equally be spaced apart from the first electrode branch 310B and the second electrode 330.

In the drawing, one end of the third electrode 330 is aligned with one end of the first electrode branch 310B and the other end of the third electrode 330 is aligned with one end of the second electrode branch 320B. For example, when a plurality of third electrodes 330 is provided, the third electrodes 330 may be substantially aligned with the first electrode branch 310B and the second electrode branch 320B in the first direction D1. It is, however, to be understood that the present disclosure is not limited thereto. In some exemplary embodiments, at least one of both ends of the third electrode 330 may protrude from the end of the first electrode branch 310B and the second electrode branch 320B. In such a case, the plurality of third electrodes 330 may be arranged between the first electrode branch 310B and the second electrode branch 320B, and both ends of some of the third electrodes 330 may not be aligned with the ends but may be protruding from them.

Such third electrodes 330 may be formed separately from the first electrode branch 310B and the second electrode branch 320B, but the present disclosure is not limited thereto. In some exemplary embodiments, the third electrode 330 may be formed to be substantially the same as the first electrode branch 310B or the second electrode branch 320B, and then may be separated during a subsequent disconnection process, such that they may be separated from the first electrode branch 310B and the second electrode 320B. Specifically, some of the third electrodes 330 may be electrically connected to the first electrode stem 310S or the second electrode stem 320S, and then may be disconnected by a laser or the like. A more detailed description thereon will be given below.

The plurality of light-emitting elements 350 may be arranged between the first electrode branch 310B and the third electrode 330 and between the third electrode 330 and the second electrode branch 320B. Specifically, some of the plurality of light-emitting elements 350 may have an end electrically connected to the first electrode branch 310B and the other end electrically connected to the side of the third electrode 330 that faces the first electrode branch 310B. In addition, some of the plurality of light-emitting elements 350 may have an end electrically connected to the other side of the third electrode 330 that faces the second electrode branch 310B and the other end electrically connected to the second electrode branch 320B.

Contact electrodes 360 may be disposed on the first electrode branch 310B, the second electrode branch 320B and the third electrode 330 connected to the light-emitting elements 350. The contact electrodes 360 may be in contact with the light-emitting elements 350 so that the light-emitting elements 350 may be electrically connected to the electrode branches 310B and 320B or the third electrode 330. The contact electrodes 360 may come in contact with at least a side portion on both ends of each of the light-emitting elements 350. Accordingly, the light-emitting elements 350 may each receive an electrical signal to emit light of a particular color.

In some exemplary embodiments, one end of each of the light-emitting elements 350 in contact with the first electrode branch 310B or the other side portion of the third electrode 330 may be an n-type or p-type doped conductive material layer, while the other end of each of the light-emitting elements 350 in contact with the one side of the third electrode 330 or the second electrode branch 320_B may be a p-type or n-type doped conductive material layer. It is, however, to be understood that the present disclosure is not limited thereto.

The plurality of light-emitting elements 350 may be arranged in parallel with one another. The light-emitting elements 350 may be equally spaced apart from one another. It is, however, to be understood that the present disclosure is not limited thereto. In some implementations, some of the light-emitting elements 350 may be disposed close to each other to form a group, and some other of the light-emitting elements 350 may be disposed close to each other to form another group that is spaced apart from the group. Alternatively, the light-emitting elements 350 may be arranged such that they are orientated in a direction with ununiform densities.

As described above, the plurality of light-emitting elements 350 may be arranged between the first electrode branch 310B and the third electrode 330 and between the third electrode 330 and the second electrode branch 320B so that they may be electrically connected to one another. The distance between the first electrode branch 310B and the second electrode branch 320B may be larger than the length of the longer axis of the light-emitting elements 350, whereas the distance between the third electrode 330 and the first electrode branch 310B and the distance between the third electrode 330 and the second electrode branch 320B may be smaller than the length of the longer axis of the light-emitting elements 350. It is, however, to be understood that the present disclosure is not limited thereto.

A light-emitting element 350 disposed between the third electrode 330 and the first electrode branch 310B may be electrically connected to a light-emitting element 350 between the third electrode 330 and the second electrode branch 320B in series. The light-emitting elements 350 may be arranged group by group in a pixel PX, so that they may form a series connection. Because the voltage applied to the light-emitting elements 350 is greater when the light-emitting elements 350 are connected in parallel, the voltage dividing efficiency can be increased. In addition, because the amount of current required to drive the light-emitting elements 350 connected in series decreases, the capacity of the driving transistor for applying the current to the light-emitting elements 350 can be reduced, and power loss due to the power supply lines can be reduced. As a result, the voltage efficiency and the luminous efficiency can be improved in driving the display device 10.

Figure 4:
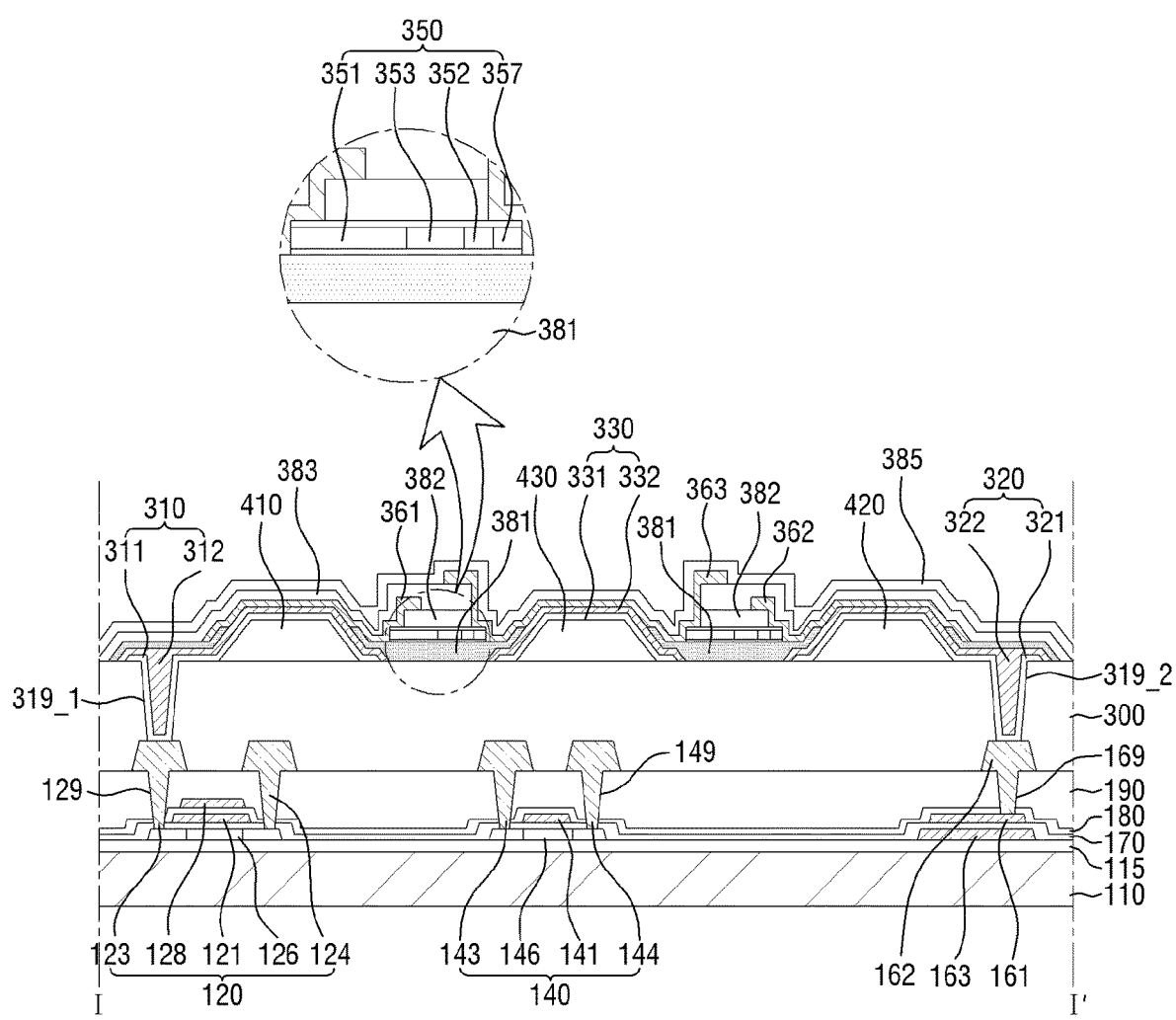
FIG. 4 is a cross-sectional view taken along the line I-I' of FIG. 1.

As shown in FIG. 1, the first electrode stem 310S and the second electrode stem 320S may be electrically connected to a thin-film transistor 120 or to a power supply line 161 (e.g., as shown in FIG. 4) to be described below through contact holes, e.g., a first contact hole CNTD and a second contact hole CNTS, respectively. Although the contact holes on the first electrode stem 310S and the second electrode stem 320S are formed in each of the pixels PX, the present disclosure is not limited thereto. Because the second electrode stem 320S may be extended and electrically connected to adjacent pixels PX as described above, in some exemplary embodiments, the second electrode stem 320S may be electrically connected to a thin-film transistor through a single contact hole.

Figure 2:
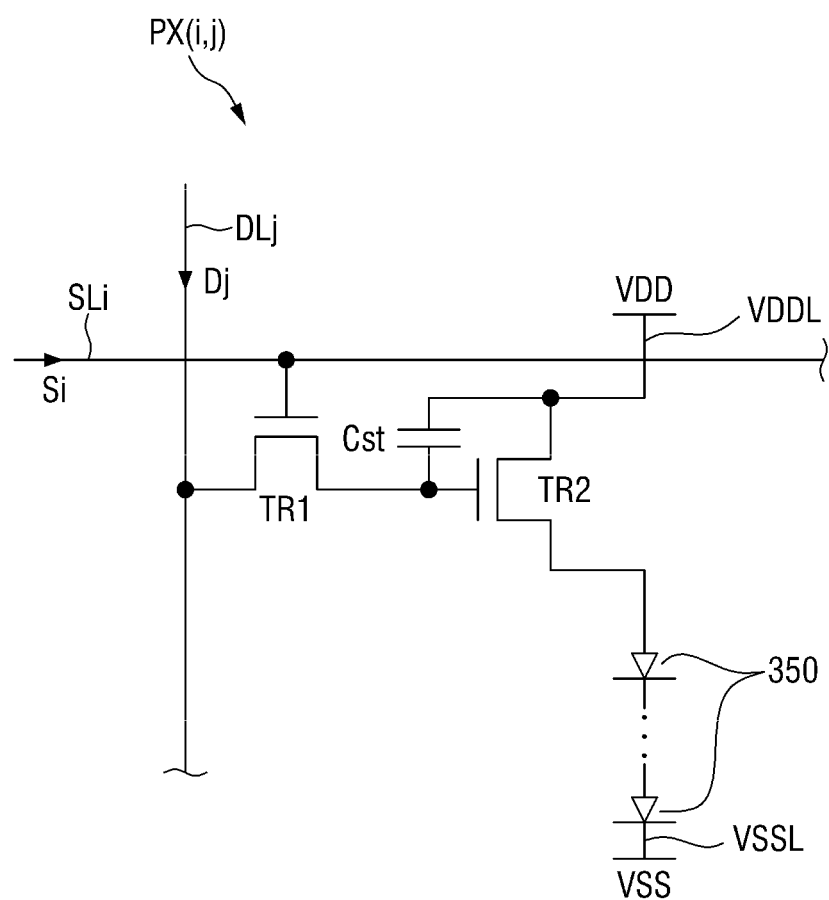
FIG. 2 is an equivalent circuit diagram of a single pixel of the display device of FIG. 1.

FIG. 2 is an equivalent circuit diagram of a single pixel of the display device of FIG. 1. Although not shown in FIG. 2, the display device 10 may include a plurality of pixels PX. FIG. 2 shows a pixel at the ith row and jth column PX (i, j) as an example.

Referring to FIG. 2, the pixel PX (i, j) of the display device 10 may include an ith scan line SLi, a jth data line DLj, a first switching element TR1, a second switching element TR2, light-emitting elements 350, and a storage capacitor Cst.

The first switching element TR1 may be electrically connected to the ith scan line SLi, the jth data line DLj, and the second switching element TR2. In an exemplary embodiment, the first switching element TR1 and the second switching element TR2 may be three terminal elements such as a thin-film transistor. In the following description, it is assumed that the first switching element TR1 and the second switching element TR2 are thin-film transistors.

The first switching element TR1 may include a control electrode electrically connected to the first scan line SL1, an electrode electrically connected to the jth data line DLj, and an other electrode electrically connected to the control electrode of the second switching element TR2.

The second switching element TR2 may include a control electrode electrically connected to the other electrode of the first switching element TR1, an electrode electrically connected to a first power supply line VDDL via which a first driving voltage VDD is applied, and an other electrode electrically connected to the light-emitting elements 350.

One electrode of the storage capacitor Cst may be electrically connected to the other electrode of the first switching element TR1, and an other electrode of the storage capacitor Cst may be electrically connected to a first power supply line VDDL via which the first driving voltage VDD is supplied.

The first switching element TR1 may be turned on in response to a scan signal Si supplied from the ith scan line SLi and may provide a data signal Dj supplied from the jth data line DLj to the storage capacitor Cst. The storage capacitor Cst may be charged with a voltage equal to a difference between the voltage of the received data signal Dj and the first driving voltage VDD. The second switching element TR2 may control the amount of driving current supplied to the light-emitting elements 350 according to the voltage charged in the storage capacitor Cst. That is to say, the first switching element TR1 may be a switching transistor, and the second switching element TR2 may be a driving transistor.

One end of the light-emitting elements 350 connected to the first electrode 310 may be electrically connected to the other electrode of the second switching element TR2. The light-emitting elements 350 may receive a current through the other electrode of the second switching element TR2. The other end of the light-emitting elements 350 connected to the second electrode 320 may be electrically connected to the second power supply line VSSL so that the second supply voltage VSS may be applied. The level of the first driving voltage VDD may be higher than the level of the second supply voltage VSS.

As shown in FIG. 2, the light-emitting elements 350 may be connected in series between the second switching element TR2 and the second power supply line VSSL via which the second supply voltage VESSEL is applied. As shown in FIG. 2, the number of the light-emitting elements 350 connected in series is not particularly limited. It is to be understood that a larger number of the light-emitting elements 350 may be connected in series. Accordingly, the first driving voltage VDD and the second supply voltage VSS for driving the light-emitting elements 350 can be more efficiently divided among the light-emitting elements 350. In addition, the current flowing through the second switching element TR2 decreases as the light-emitting elements 350 are connected in series, and thus it is easier to design the capacity of the thin-film transistors. Because the magnitude of current decreases, the power loss on the power supply line or the first power supply line VDDL and the second power supply line VSSL can be reduced.

In the example shown in FIG. 2, the display device 10 includes two switching elements, i.e., the first switching element TR1 and the second switching element TR2, and a single capacitor, i.e., the storage capacitor Cst. It is, however, to be understood that the present disclosure is not limited thereto. In some exemplary embodiments, the display device 10 may include a greater number of switching elements. Hereinafter, an equivalent circuit diagram of the display device 10 according to another exemplary embodiment will be described with reference to FIG. 3.

Figure 3:
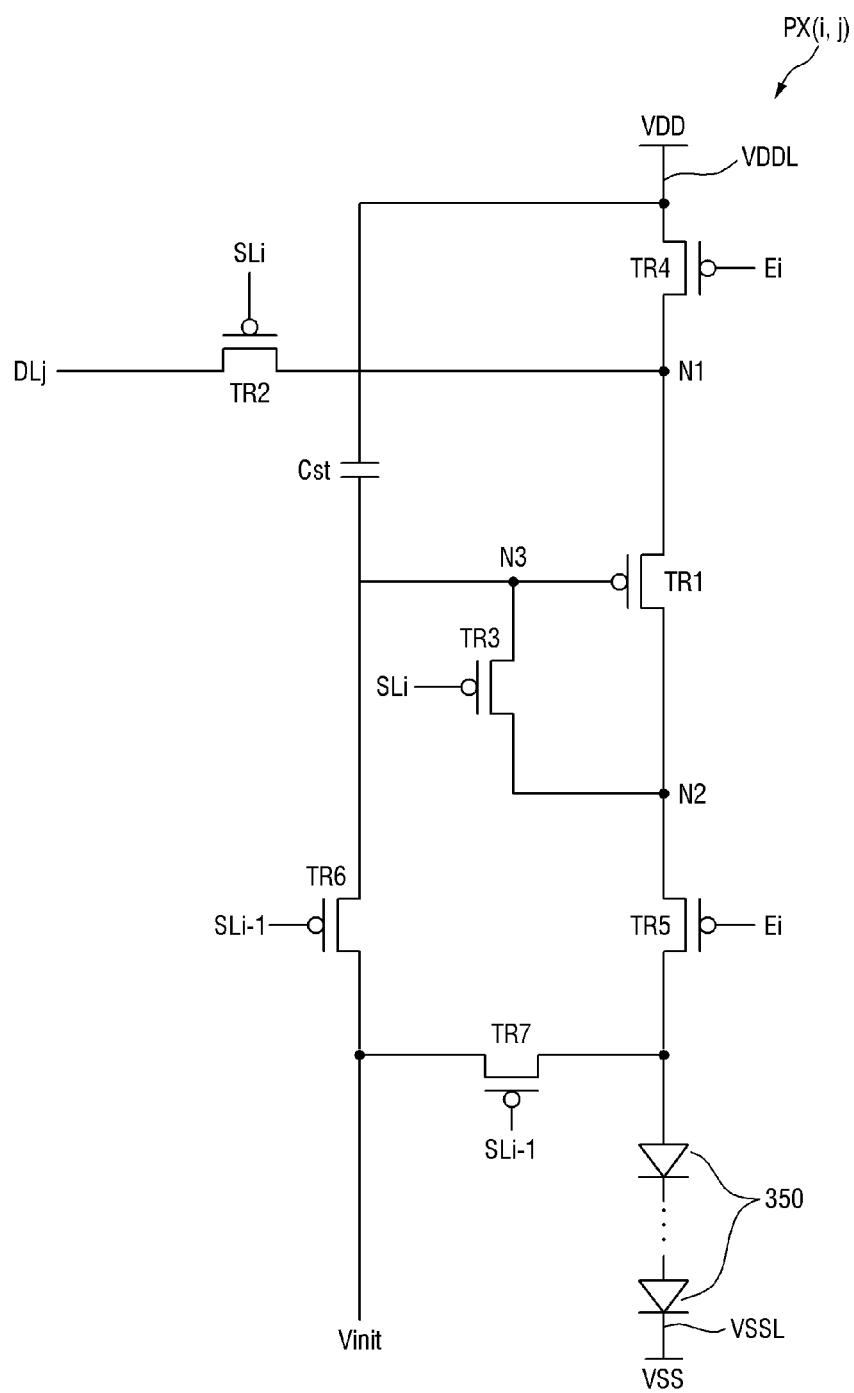
FIG. 3 is an equivalent circuit diagram of a pixel of a display device according to another exemplary embodiment of the present disclosure.

FIG. 3 is an equivalent circuit diagram of a pixel of a display device according to another exemplary embodiment of the present disclosure. FIG. 3 shows a pixel at the ith row and the jth column PX (i, j) as an example.

Referring to FIG. 3, the pixel PX (i, j) of the display device 10 may include an ith scan line SLi, an (i−1)th scan line SL(i−1), a jth data line DLj, an ith emission control line Ei, first to seventh switching elements TR1 to TR7, light-emitting elements 350, and a storage capacitor Cst.

One end of the light-emitting elements 350 connected to the first electrode 310 may be electrically connected to one electrode of the fifth switching element TR5 and to one electrode of the seventh switching element TR7. The light-emitting elements 350 may receive a current through the electrode of the fifth switching element TR5 and the electrode of the seventh switching element TR7. The other end of the light-emitting elements 350 connected to the second electrode 320 may be electrically connected to the second power supply line VSSL so that the second supply voltage VSS may be applied.

One electrode of the first switching element TR1 is electrically connected to a first node N1, and an other electrode of the first switching element TR1 is electrically connected to a second node N2. A gate electrode of the first switching element TR1 is electrically connected to one end of the storage capacitor Cst through a third node N3. The first switching element TR1 is electrically connected to one end of the light-emitting elements 350 via the fifth switching element TR5. The first switching element TR1 may receive the data signal of the jth data line DLj and supply a current to the light-emitting elements 350 according to the switching operation of the second switching element TR2.

One electrode of the second switching element TR2 is electrically connected to the jth data line DLj, and an other electrode of the second switching element TR2 is electrically connected to the first node N1. A gate electrode of the second switching element TR2 is electrically connected to the ith scan line SLi. The other electrode of the second switching element TR2 is electrically connected to the first node N1, which is electrically connected to the first power supply line VDDL through the fourth switching element TR4. The second switching element may be turned on in response to a scan signal on the ith scan line SLi, and may perform a switching operation to transfer the data signal transferred to the jth data line DLj to the first switching element TR1.

One electrode of the third switching element TR3 is electrically connected to the second node N2, and an other electrode of the third switching element TR3 is electrically connected to the third node N3. A gate electrode of the third switching element TR3 is electrically connected to the ith scan line SLi. When a scan signal is applied to the ith scan line SLi, the third switching element TR3 is turned on and the first switching element TR1 is diode-connected.

One electrode of the fourth switching element TR4 is electrically connected to the first power supply line VDDL to receive the first driving voltage VDD. An other electrode of the fourth switching element TR4 is electrically connected to the first node N1, and a gate electrode of the fourth switching element TR4 is electrically connected to the ith emission control line Ei.

One electrode of the fifth switching element TR5 is electrically connected to the second node N2, and an other electrode of the fifth switching element TR5 is electrically connected to the one end of the light-emitting elements 350. A gate electrode of the fifth switching element TR5 is electrically connected to the ith emission control line Ei. The fourth switching element TR4 and the fifth switching element TR5 are turned on simultaneously according to the emission control signal transmitted via the ith emission control line Ei so that the first driving voltage VDD is applied to the light-emitting elements 350, thereby allowing the driving current to flow through the light-emitting elements 350. One electrode of the sixth switching element TR6 is electrically connected to the third node N3, and an other electrode of the sixth switching element TR6 is supplied with an initializing voltage Vinit. The gate electrode of the sixth switching element TR6 is electrically connected to the (i−1)th scan line SL(i−1). Because the scan signal is sequentially supplied to the scan lines SL, the scan signal may be supplied to the (i−1)th scan line SL(i−1) and then to the ith scan line SLi. The sixth switching element TR6 is turned on in response to the scan signal transmitted via the (i−1)th scan line SL(i−1) to transmit the initializing voltage Vinit to the gate electrode of the first switching element TR1, thereby initializing the voltage of the gate electrode of the first switching element TR1.

One electrode of the seventh switching element TR7 is electrically connected to the one end of the light-emitting elements 350, and an other electrode of the seventh switching element TR7 is supplied with the initializing voltage Vinit. A gate electrode of the seventh switching element TR7 is electrically connected to the (i−1)th scan line SL(i−1). The seventh switching element TR7 may be turned on in response to the scan signal to initialize the one end electrode of the light-emitting elements 350.

The first to seventh switching elements TR1 to TR7 may be thin-film transistors. In each of the first to seventh switching elements TR1 to TR7, one electrode may be a source electrode or a drain electrode, and the other electrode may be the drain electrode or the source electrode.

One end of the storage capacitor Cst may be electrically connected to the first power supply line VDDL to receive the first driving voltage VDD, and the other end may be electrically connected to the third node N3.

Hereinafter, a number of elements disposed on the display device 10 will be described in more detail with reference to FIG. 4.

FIG. 4 is a cross-sectional view taken along the line I-I' of FIG. 1. Although FIG. 4 shows only one pixel PX, it is to be understood that the description can be equally applied to other pixels as well.

Referring to FIGS. 1 and 4, a display device 10 may include a substrate 110, thin-film transistors 120 and 140 disposed on the substrate 110, electrodes 310, 320 and 330 and light-emitting elements 350 disposed above the thin-film transistors 120 and 140. The thin-film transistors may include the first thin-film transistor 120 and the second thin-film transistor 140, which may be a driving transistor and a switching transistor, respectively. Each of the thin-film transistors 120 and 140 may have an active layer, a gate electrode, a source electrode and a drain electrode. The first electrode 310 may be electrically connected to the drain electrode of the first thin-film transistor 120.

More specifically, the substrate 110 may be an insulating substrate. The substrate 110 may be made of an insulating material such as glass, quartz or a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 110 may be either a rigid substrate or a flexible substrate that can be bent, folded, or rolled.

A buffer layer 115 may be disposed on the substrate 110. The buffer layer 115 may prevent impurity ions from diffusing, may prevent permeation of moisture or outside air, and may provide a flat surface. The buffer layer 115 may include silicon nitride, silicon oxide, silicon oxynitride, or the like.

A semiconductor layer is disposed on the buffer layer 115. The semiconductor layer may include a first active layer 126 of the first thin-film transistor 120, a second active layer 146 of the second thin-film transistor 140, and an auxiliary layer 163. The semiconductor layer may include polycrystalline silicon, monocrystalline silicon, an oxide semiconductor, etc.

A first gate insulating layer 170 is disposed on the semiconductor layer. The first gate insulating layer 170 covers the semiconductor layer. The first gate insulating layer 170 may work as a gate insulating layer of the thin-film transistors. The first gate insulating layer 170 may include silicon oxide, silicon nitride, silicon oxynitride, aluminum oxide, tantalum oxide, hafnium oxide, zirconium oxide, titanium oxide, etc. They may be used alone or in combinations.

A first conductive layer is disposed on the first gate insulating layer 170. The first conductive layer may include a first gate electrode 121, a second gate electrode 141 and a power supply line 161 that are disposed on the first active layer 126 of the first thin-film transistor 120, on the second active layer 146 of the second thin-film transistor 140, and on the auxiliary layer 163, respectively, with the first gate insulating layer 170 therebetween. The first conductive layer may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer may be made up of a single layer or multiple layers.

A second gate insulating layer 180 is disposed on the first conductive layer. The second gate insulating layer 180 may be an interlayer dielectric layer. The second gate insulating layer 180 may be made of an inorganic insulating material such as silicon oxide, silicon nitride, silicon oxynitride, hafnium oxide, aluminum oxide, titanium oxide, tantalum oxide or zinc oxide.

A second conductive layer is disposed on the second gate insulating layer 180. The second conductive layer includes a capacitor electrode 128 disposed above the first gate electrode 121 with a second insulating layer therebetween. The capacitor electrode 128 may form a storage capacitor with the first gate electrode 121.

The second conductive layer may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu), like the first conductive layer described above.

An interlayer dielectric layer 190 is disposed on the second conductive layer. The interlayer dielectric layer 190 may be an interlayer dielectric film. The interlayer dielectric layer 190 may also provide a flat surface. The interlayer dielectric layer 190 may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB).

A third conductive layer is disposed on the interlayer dielectric layer 190. The third conductive layer includes the first drain electrode 123 and the first source electrode 124 of the first thin-film transistor 120, the second drain electrode 140 and the second source electrode 144 of the second thin-film transistor 140, and a power supply electrode 162 disposed on the power supply line 161.

The first source electrode 124 and the first drain electrode 123 may be electrically connected to the first active layer 126 through the first contact holes 129 penetrating the interlayer dielectric layer 190 and the second gate insulating layer 180, respectively. The second source electrode 144 and the second drain electrode 143 may be electrically connected to the second active layer 146 through the second contact holes 149 penetrating the interlayer dielectric layer 190 and the second gate insulating layer 180, respectively. The power supply electrode 162 may be electrically connected to the power supply line 161 through a third contact hole 169 penetrating the interlayer dielectric layer 190 and the second gate insulating layer 180.

The third conductive layer may include at least one metal selected from the group consisting of: aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer may be made up of a single film or multiple films. For example, the third conductive layer may have a stack structure of Ti/Al/Ti, Mo/Al/Mo, Mo/AlGe/Mo, and Ti/Cu.

An insulating substrate layer 300 is disposed over the third conductive layer. The insulating substrate layer 300 may be made of an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The surface of the insulating substrate layer 300 may be flat.

A plurality of pixel-defining layers 410, 420 and 430 may be disposed on the insulating substrate layer 300. The pixel-defining layers 410, 420 and 430 may be disposed in each of the pixels PX and may be spaced apart from one another. The first electrode 310, the second electrode 320 and the third electrode 330 may be disposed on the first pixel-defining layer, 410, the second pixel-defining layer 420 and the third pixel-defining layer 430, respectively. In the examples shown in FIGS. 1 and 4, three pixel-defining layers 410, 420 and 430 are disposed in one pixel PX, and the first electrode 310, the second electrode 320 and the third electrode 330 are arranged.

It is, however, to be understood that the present disclosure is not limited thereto. A greater number of pixel-defining layers 410, 420 and 430 may be disposed in one pixel PX. For example, when a greater number of third electrodes 330 are disposed between the first electrode 310 and the second electrode 320, the pixel PX may have a greater number of pixel-defining layers. The pixel-defining layers 410, 420 and 430 may include at least one first pixel-defining layer 410 on which the first electrode 310 is disposed, at least one second pixel-defining layer 420 on which the second electrode 320 is disposed, and at least one third pixel-defining layer 430 on which the third electrode 330 is disposed. In such a case, the first pixel-defining layer 410 and the second pixel-defining layer 420 may be spaced apart from each other, and a plurality of third pixel-defining layer 430 may be disposed therebetween. For another example, the first pixel-defining layer 410, the second pixel-defining layer 420 and the third pixel-defining layer 430 may be alternately arranged in one direction. In some exemplary embodiments, two first pixel-defining layers 410 may be disposed apart from each other, one second pixel-defining layer 420 may be disposed between the first pixel-defining layers 410, and at least one third pixel-defining layer 430 may be disposed between the second pixel-defining layer 420 and each of the first pixel-defining layers 410.

The plurality of pixel-defining layers 410, 420 and 430 may be made of substantially the same material via a single process. In such a case, the pixel-defining layer ribs 410, 420 and 430 may form a single lattice pattern. The pixel-defining layers 410, 420 and 430 may include polyimide (PI).

Although not shown in the drawings, at least some of the plurality of pixel-defining layers 410, 420 and 430 may be disposed at the boundaries between the pixels PX so as to distinguish one from another. Such pixel-defining layers may also be disposed in a substantially lattice pattern together with the first pixel-defining layer 410, the second pixel-defining layer 420, and the third pixel-defining layer 430 described above. At least some of the pixel-defining layers 410, 420 and 430 disposed at the boundaries between the pixels PX may be formed to cover the electrode lines of the display device 10.

Reflective layers 311, 321 and 331 may be disposed on the pixel-defining layers 410, 420 and 430.

The first reflective layer 311 covers the first pixel-defining layer 410 and is electrically connected to the first drain electrode 123 of the first thin-film transistor 120 through a fourth contact hole 319_1 penetrating the insulating substrate layer 300. The second reflective layer 321 covers the second pixel-defining layer 420 and is electrically connected to the power supply electrode 162 through a fifth contact hole 319_2 penetrating through the insulating substrate layer 300. The third reflective layer 331 covers the third pixel-defining layer 430, and both ends thereof are spaced apart from the first reflective layer 311 and the second reflective layer 321. Unlike the first reflective layer 311 and the second reflective layer 321, the third reflective layer 331 is connected to none of the thin-film transistors through a contact hole.

The first reflective layer 311 may be electrically connected to the first drain electrode 123 of the first thin-film transistor 120 through the fourth contact hole 319_1 in the pixel PX. Accordingly, the first thin-film transistor 120 may be disposed in an area overlapping the pixel PX. In the example shown in FIG. 1, the first reflective layer 311 is electrically connected to the first thin-film transistor 120 through the first electrode contact hole CNTD formed on the first electrode stem 310S. That is to say, the first electrode contact hole CNTD may be the fourth contact hole 319_1.

The second reflective layer 321 may also be electrically connected to the power supply electrode 162 through the fifth contact hole 319_2 in the pixel PX. In FIG. 4, the second reflective layer 321 is connected through the fifth contact hole 319_2 in one pixel PX. FIG. 1 illustrates that the second electrode 320 of each pixel PX is electrically connected to the power supply line 161 through a plurality of second electrode contact holes CNTS on the second electrode stem 320S. That is to say, the second electrode contact hole CNTS may be the fifth contact hole 319_2. It is, however, to be understood that the present disclosure is not limited thereto. For example, in FIG. 1, the second electrode contact hole CNTS may be formed at various positions on the second electrode stem 320S, and on some implementations, may be located on the second electrode branch 320B. Further, in some exemplary embodiments, the second reflective layer 321 may be connected to one second electrode contact hole CNTS or the fifth contact hole 319_2 in an area other than one pixel PX.

Figure 5:
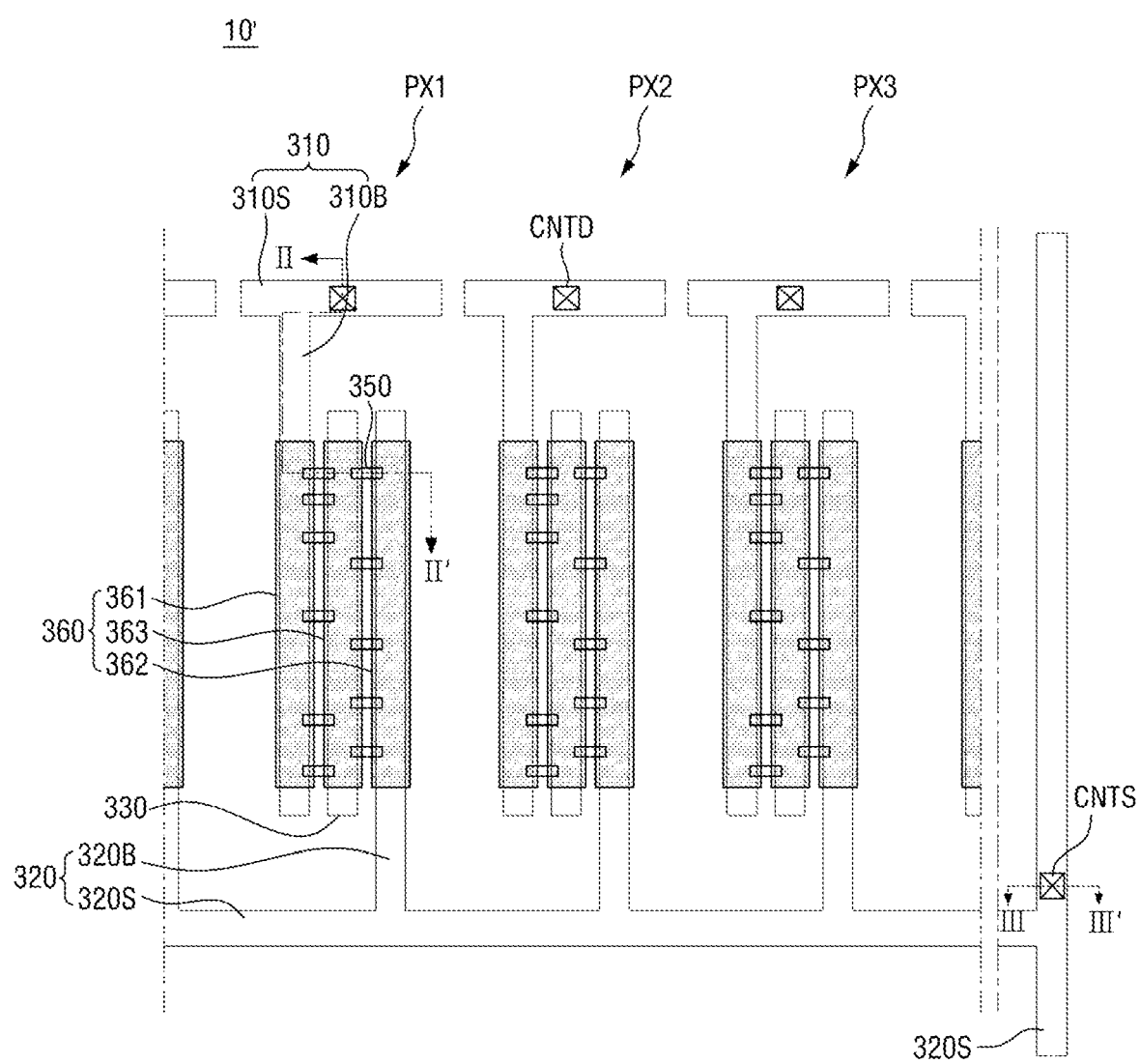
FIG. 5 is a plan view of a display device according to another exemplary embodiment of the present disclosure.
Figure 6:
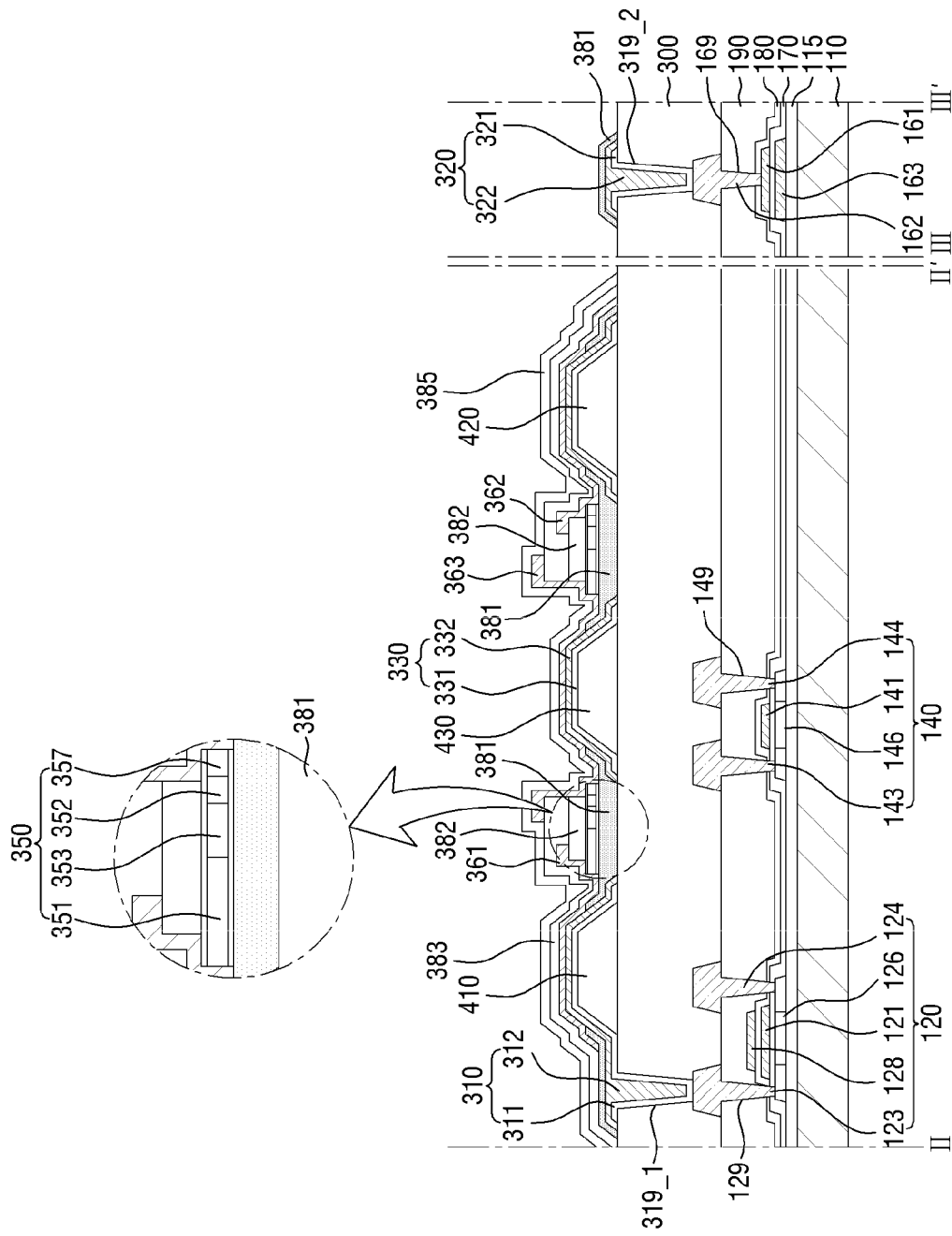
FIG. 6 is a cross-sectional view taken along the lines II-II' and III-III' of FIG. 5.

FIG. 5 is a plan view of a display device according to another exemplary embodiment of the present disclosure. FIG. 6 is a cross-sectional view taken along the lines II-II' and III-III' of FIG. 5.

There may be a non-emission area where no light-emitting element 350 is disposed, e.g., in an area other than the emission portion where the pixels PX of the display device 10 are disposed, for example, on the outer side of the pixels PX. As described above, the second electrodes 320 of each pixel PX may be electrically connected to each other through the second electrode stem 320S to receive the same electric signal.

Referring to FIGS. 5 and 6, in some exemplary embodiments, the second electrode stem 320S of the second electrode 320 may be electrically connected to the power supply electrode 162 through a second electrode contact hole CNTS in the non-emission area located on the outer side portion of the display device 10. Unlike the display device 10 shown in FIG. 1, even though the second electrode stem 320S is connected to the power supply electrode 162 through one contact hole, because the second electrode stem 320S is extended to and electrically connected to the adjacent pixel PX, it is possible to apply the same electrical signal to the second electrode branch 320B of each pixel PX. For the second electrode 320 of the display device 10, the position of the contact hole for receiving the electric signal from the power supply electrode 162 may vary according to the structure of the display device 10. However, this is merely illustrative.

Referring back to FIGS. 1 and 4, the reflective layers 311, 321 and 331 may include a material having a high reflectivity to reflect light emitted from the light-emitting elements 350. For example, the reflective layers 311, 321 and 331 may include, but is not limited to, materials such as silver (Ag) and copper (Cu).

At least a part of the plurality of pixel-defining layers 410, 420 and 430 may protrude from the insulating substrate layer 300. The pixel-defining layers 410, 420 and 430 may protrude upwardly from the plane on which the light-emitting elements 350 are disposed, and at least a part of the protruding portions may have an inclination. The pixel-defining layers 410, 420 and 430 protruding with an inclination can reflect light incident on the reflective layers 311, 321 and 331 disposed thereon. Light directed from the light-emitting elements 350 to the reflective layers 311, 321 and 331 may be reflected off them and transmitted toward the outside of the display device 10, for example, above the pixel-defining layers 410, 420 and 430.

The first electrode layer 312, the second electrode layer 322 and the third electrode layer 332 may be disposed on the first reflective layer 311, the second reflective layer 321, and the third reflective layer 331, respectively.

The first electrode layer 312 is disposed directly on the first reflective layer 311. The first electrode layer 312 may have substantially the same pattern as the first reflective layer 311. The second electrode layer 322 is disposed directly on the second reflective layer 321. The second electrode layer 322 may have substantially the same pattern as the second reflective layer 321. The third electrode layer 332 is disposed directly on the third reflective layer 331 and is spaced apart from the first electrode layer 312 and the second electrode layer 322. The third electrode layer 332 may have substantially the same pattern as the third reflective layer 331.

In an exemplary embodiment, the electrode layers 321, 322 and 332 may cover the reflective layers 311, 321 and 331 thereunder, respectively. That is to say, the electrode layers 321, 322 and 332 may be larger than the reflective layers 311, 321 and 331 to cover the side surfaces of the ends of the electrode layers 321, 322, and 332. It is, however, to be understood that the present disclosure is not limited thereto.

The first electrode layer 312 and the second electrode layer 322 may transmit electrical signals transmitted to the first reflective layer 311 and the second reflective layer 321 connected to the first thin-film transistor 120 and the power supply electrode 162, respectively, to the contact electrodes to be described below. The electrode layers 312, 322 and 332 may include a transparent conductive material. For example, the electrode layers 312, 322 and 332 may include, but is not limited to, a material such as indium tin oxide (ITO), indium zinc oxide (IZO) and indium tin zinc oxide (ITZO). In some exemplary embodiments, each of the reflective layers 311, 321 and 331 and the electrode layers 312, 322 and 332 may have a structure in which at least one transparent conductive layer such as ITO, IZO and ITZO and at least one metal layer such as silver and copper are stacked on one another. For example, the reflective layers 311, 321 and 331 and the electrode layers 312, 322 and 332 may form a stack structure of ITO/silver (Ag)/ITO.

The first reflective layer 311 and the first electrode layer 312, which are disposed on the first pixel-defining layer 410, form the first electrode 310. The first electrode 310 may protrude to areas extended from both ends of the first pixel-defining layer 410 so that the first electrode 310 may be in contact with the insulating substrate layer 300. The second reflective layer 321 and the second electrode layer 322, which are disposed on the second pixel-defining layer 420, form the second electrode 320. The second electrode 320 may protrude to areas extended from both ends of the second pixel-defining layer 420 so that the second electrode 320 may be in contact with the insulating substrate layer 300. The third reflective layer 331 and the third electrode layer 332, which are disposed on the third pixel-defining layer 430, form the third electrode 330. The third electrode 330 may protrude to areas extended from both ends of the third pixel-defining layer 430 so that the third electrode 330 may be in contact with the insulating substrate layer 300.

The first electrode 310, the second electrode 320 and the third electrode 330 are arranged to cover the entire area of the first pixel-defining layer 410, the second pixel-defining layer 420 and the third pixel-defining layer 430. As described above, the first electrode 310 may be spaced apart from and face the third electrode 330, and the third electrode 330 may be spaced apart from and face the second electrode 320. A first insulating layer 381 may be disposed between the electrodes spaced apart from one another, which will be described in detail below, and the light-emitting elements 350 may be disposed on the first insulating layer 381.

Because the first reflective layer 311 may receive a driving voltage from the first thin-film transistor 120 and the second reflective layer 321 may receive a supply voltage from the power supply line 161, the first electrode 310 and the second electrode 320 receive the driving voltage and the supply voltage, respectively. As will be described below, the first electrode 310 may be electrically connected to the first thin-film transistor 120, and the second electrode 320 may be electrically connected to the power supply line 161. Accordingly, a first contact electrode 361 and a second contact electrode 362 disposed on the first electrode 310 and the second electrode 320, respectively, can receive the driving voltage and the supply voltage. The third electrode 330 disposed between the first electrode 310 and the second electrode 320 may transmit the driving voltage and the supply voltage to the light-emitting elements 350 through a third contact electrode 363 disposed thereon, such that a current flows in the light-emitting elements 350 to emit light.

The first insulating layer 381 is disposed on a part of the first electrode 310, the second electrode 320 and the third electrode 330. The first insulating layer 381 may be disposed in the space between the first electrode 310 and the third electrode 330 and between the third electrode 330 and the second electrode 320. The first insulating layer 381 may have an island shape or a linear shape formed along the space between the first electrode branch 310B, the second electrode branch 320B, and the third electrode 330 when viewed from the top.

The light-emitting elements 350 are disposed on the first insulating layer. The first insulating layer 381 may be disposed between the light-emitting elements 350 and the insulating substrate layer 300. The lower surface of the first insulating layer 381 may be in contact with the insulating substrate layer 300, and the light-emitting elements 350 may be disposed on the upper surface of the first insulating layer 381. The first insulating layer 381 is in contact with the electrodes 310, 320, and 330 on both sides and can electrically insulate them from each other.

The first insulating layer 381 may overlap with a portion of each of the electrodes 310, 320 and 330, for example, a region protruding in a direction in which the first electrode 310 and the third electrode 330 face each other, and a region protruding in a direction in which the third electrode 330 and the second electrode 320 face each other. In addition, the first insulating layer 381 may be disposed on the inclined side surfaces of the pixel-defining layers 410, 420 and 430 among the regions on the electrodes 310, 320 and 330. Accordingly, the lower surface of the first insulating layer 381 may be in contact with the insulating substrate layer 300 and the electrodes 310, 320 and 330. At least one side portion of the first insulating layer 381 may be in contact with each of the electrodes 310, 320 and 330 as well. A part of the upper surface of the electrodes 310, 320 and 330 where the first insulating layer 381 is not disposed may be exposed. In addition, the first insulating layer 381 may be disposed such that both sides of the light-emitting elements 350 are exposed. Accordingly, the contact electrodes 361, 362 and 363 described below may be in contact with the exposed upper surfaces of the electrodes 310, 320 and 330 and both sides of the light-emitting elements 350.

For example, the first insulating layer 381 may cover the upper surface of the regions where the first electrode 310 faces the third electrode 330, and the third electrode 330 faces the second electrode 320. The first insulating layer 381 protects the overlapped regions with the electrodes 310, 320 and 330 and electrically insulates them from each other. In addition, the first insulating layer 381 prevents a first conductivity-type semiconductor layer 351 and the second conductivity-type semiconductor layer 352 of the light-emitting element 350 from being in contact with other substrates, so that damage to the light-emitting element 350 can be avoided.

At least one light-emitting element 350 may be disposed between the first electrode 310 and the third electrode 330 and between the third electrode 330 and the second electrode 320. Accordingly, the plurality of light-emitting elements 350 may be connected in series. FIG. 1 illustrates an example where only the light-emitting elements 350 that emit light of the same color are disposed in each pixel PX. It is to be understood that the light-emitting elements 350 for emitting light of different colors may be disposed in one pixel PX, as mentioned earlier.

The distance between the first electrode 330 and the third electrode 330, and the distance between the third electrode 330 and the second electrode 320 may be less than or equal to the length of the light-emitting elements 350, as described above. Accordingly, an electrical contact between the light-emitting elements 350 and each of the first electrode 310, the second electrode 320, and the third electrode 330 can be made easily and reliably.

The light-emitting elements 350 may be light-emitting diodes. The light-emitting elements 350 may be a nanostructure generally having its size in a nanometer scale. The light-emitting elements 350 may be inorganic light-emitting diodes made of an inorganic material. When the light-emitting element 350 is an inorganic light-emitting diode, by disposing a light-emitting material having an inorganic crystal structure between two opposing electrodes and applying an electric field in a direction across the light-emitting material, the inorganic light-emitting diodes can be aligned between the two electrodes having the polarities.

Referring to the enlarged circle of FIG. 4, in some exemplary embodiments, the light-emitting element 350 may include a first conductivity-type semiconductor layer 351, an active material layer 353, a second conductivity-type semiconductor layer 352 and an electrode material layer 357, which will be described in detail below. The light-emitting element 350 may be formed by stacking the first conductivity-type semiconductor layer 351, the active material layer 353, the second conductivity-type semiconductor layer 352 and the electrode material layer 357 in parallel with the insulating substrate layer 300. In other words, the light-emitting element 350, in which the plurality of layers are stacked, may be disposed in the horizontal direction in parallel with the insulating substrate layer 300. It is, however, to be understood that the present disclosure is not limited thereto. The layers of the light-emitting element 350 may be stacked on one another in the opposite order.

In an exemplary embodiment, the first conductivity-type semiconductor layer 351 of the light-emitting element 350 may be electrically connected to a side of the first electrode 310 or the third electrode 330 that faces the second electrode 320, and the second conductivity-type semiconductor layer 352 or the electrode material layer 357 of the light-emitting element 350 may be electrically connected to the other side of the third electrode 330 or the second electrode 320. The configuration of the light-emitting element 350 will be described in more detail later.

The second insulating layer 382 may be disposed on the light-emitting element 350 to protect the light-emitting element 350 and to fix it between the electrodes 310, 320 and 330. Although not shown in FIG. 4, the second insulating layer 382 may be disposed on the outer surface of the light-emitting elements 350 to fix them. The second insulating layer 382 may be disposed on a part of the outer surface of the light-emitting element 350 so that both side surfaces of the light-emitting element 350 are exposed. Specifically, the length of the second insulating layer 382 is smaller than that of the light-emitting element 350, so that the second insulating layer 382 may be recessed inwardly from both sides of the light-emitting element 350. Accordingly, the side surfaces of the first insulating layer 381, the light-emitting element 350 and the second insulating layer 382 may have a stair-like shape. In such a case, the second insulating layer 382 is disposed like the first insulating layer 381, so that the contact electrodes 361, 362 and 363 can be brought into contact with the side surfaces of the light-emitting element 350 easily and reliably. It is, however, to be understood that the present disclosure is not limited thereto. The length of the second insulating layer 382 may be equal to the length of the light-emitting element 350 and the both sides may be aligned with each other.

On the second insulating layer 382, the first contact electrode 361 disposed on the first electrode 310 and overlapping with at least a part of the second insulating layer 382, the second contact electrode 362 disposed on the second electrode 320 and overlapping with at least a part of the second insulating layer 382, and the third contact electrode 363 disposed on the third electrode 330 and spaced apart from the first contact electrode 361 and the second contact electrode 362 may be disposed.

The first contact electrode 361 and the second contact electrode 362 may be disposed on the upper surfaces of the first electrode 310 and the second electrode 320, respectively. Specifically, the first contact electrode 361 and the second contact electrode 362 may be disposed on the upper surfaces of the first electrode 310 and the second electrode 320 to be in contact with the first electrode layer 312 and the second electrode layer 322, respectively. The first contact electrode 361 and the second contact electrode 362 may be in contact with the first conductivity-type semiconductor layer 351 and the second conductivity-type semiconductor layer 352 of the light-emitting element 350, respectively. Accordingly, the first contact electrode 361 and the second contact electrode 362 may transmit electric signals applied to the first electrode layer 312 and the second electrode layer 322 to the light-emitting element 350.

The first contact electrode 361 may be disposed on and partially cover the first electrode 310. The lower surface of the first contact electrode 361 may be in contact with a part of each of the light-emitting element 350, the first insulating layer 381 and the second insulating layer 382. One end of the first contact electrode 361 closer to the third electrode 330 is disposed on the second insulating layer 382. The second contact electrode 362 may be disposed on and partially cover the second electrode 320. The lower surface of the second contact electrode 362 may be in contact with a part of each of the light-emitting element 350, the first insulating layer 381 and the second insulating layer 382. One end of the second contact electrode 362 closer to the third electrode 330 is disposed on the second insulating layer 382.

As shown in FIG. 1, neither first contact electrode 361 nor the second contact electrode 362 is disposed on the first electrode contact hole CNTD formed in the first electrode stem 310S and the second electrode contact hole CNTS formed in the second electrode stem 320S. That is to say, the first contact electrode 361 and the second contact electrode 362 may not overlap with the first electrode contact hole CNTD and the second electrode contact hole CNTS, respectively. It is, however, to be understood that the present disclosure is not limited thereto. In some implementations, a part of each of the first contact electrode 361 and the second contact electrode 362 may be disposed on the first electrode 310 and the second electrode 320 such that they overlap with the first electrode contact hole CNTD and the second electrode contact hole CNTS, respectively.

The third contact electrode 363 may be disposed on and partially cover the third electrode 330. The lower surface of the third contact electrode 363 may be in contact with a part of each of the light-emitting element 350, the first insulating layer 381 and the third insulating layer 383. Both ends of the third contact electrode 363 closer to the first electrode 310 and the second electrode 320, respectively, are disposed on the third insulating layer 383.

The first contact electrode 361 and the second contact electrode 362 may be apart from the third contact electrode 363 on the second insulating layer 382 or the third insulating layer 383. Specifically, the first contact electrode 361, the second contact electrode 362 and the third contact electrode 363 are in contact with the second insulating layer 382 or the third insulating layer 383 together with the light-emitting element 350, but are spaced apart from one another in the stacking direction and not connected to one another on the second insulating layer 382. Accordingly, the first contact electrode 361 and the second contact electrode 362 may receive different power from the first thin-film transistor 120 and the power supply line 161. For example, the first contact electrode 361 may receive a driving voltage applied to the first electrode 310 from the first thin film transistor 120, and the second contact electrode 362 may receive a common supply voltage applied to the second electrode 320 from the power supply line 161. It is, however, to be understood that the present disclosure is not limited thereto.

The contact electrodes 361, 362 363 may include a conductive material. For example, the contact electrodes may include ITO, IZO, ITZO, aluminum (Al), etc. It is, however, to be understood that the present disclosure is not limited thereto.

In addition, the contact electrodes 361, 362 and 363 may include the same material as the electrode layers 312, 322 and 332. The contact electrodes 361, 362 and 363 may be arranged in substantially the same pattern on the electrode layers 312, 322 and 332 so as to be in contact with the electrode layers 312, 322 and 332. For example, the first contact electrode 361 and the second contact electrode 362 which are in contact with the first electrode layer 312 and the second electrode layer 322, respectively, receive electrical signals applied to the first electrode layer 312 and the second electrode layer 322 to transmit them to the light-emitting element 350.

The third insulating layer 383 may be disposed on the first contact electrode 361 and the second contact electrode 362 so that the first contact electrode 361 and the second contact electrode 362 are electrically insulated from the third contact electrode 363. The third insulating layer 383 is disposed to cover the first contact electrode 361 and the second contact electrode 362 but does not overlap with a part of the light-emitting element 350 so that the light-emitting element 350 can be in contact with the third contact electrode 363. The third insulating layer 383 may be partially in contact with the first contact electrode 361, the second contact electrode 362 and the second insulating layer 382 on the upper surface of the second insulating layer 382. The third insulating layer 383 may be disposed on the upper surface of the second insulating layer 382 so that it covers one end of the first contact electrode 361 and the second contact electrode 362. Accordingly, the third insulating layer 383 may protect the first contact electrode 361 and the second contact electrode 362 and electrically insulate them from the third contact electrode 363.

One end of the third insulating layer 383 closer to the third electrode 330 may be aligned with one side of the second insulating layer 382.

In some exemplary embodiments, the third insulating layer 383 may be eliminated from the display device 10. Then, the first contact electrode 361, the second contact electrode 362, and the third contact electrode 363 may be disposed on substantially the same plane, and the first contact electrode 361, the second contact electrode 362 and the third contact electrode 363 may be electrically insulated from one another by a passivation layer 385, which will be described later. More detailed description thereon will be given with reference to other exemplary embodiments.

The passivation layer 385 may be formed over the third insulating layer 383 and the third contact electrode 363 to protect elements disposed on the insulating substrate layer 300 from the external environment. If the first contact electrode 361, the second contact electrode 362 and the third contact electrode 363 are exposed, the electrodes may be damaged and thus there may arise a problem of disconnection. To prevent this, the passivation layer 385 is disposed to cover them. That is to say, the passivation layer 385 may be disposed to cover the first electrode 310, the second electrode 320, the third electrode 330, the light-emitting element 350, etc. If the third insulating layer 383 is eliminated as described above, the passivation layer 385 may be formed on the first contact electrode 361, the second contact electrode 362 and the third contact electrode 363. In such a case, the passivation layer 385 may electrically insulate the first contact electrode 361, the second contact electrode 362 and the third contact electrode 363 from one another.

Each of the first insulating layer 381, the second insulating layer 382, the third insulating layer 383 and the passivation layer 385 may include an inorganic insulating material. For example, the first insulating layer 381, the second insulating layer 382, the third insulating layer 383, and the passivation layer 385 may include a material such as silicon oxide (SiOx), silicon nitride (SiNx), silicon oxynitride (SiOxNy), aluminum oxide ($Al_2O_3$) and aluminum nitride (AlN). The first insulating layer 381, the second insulating layer 382, the third insulating layer 383 and the passivation layer 385 may be formed of either the same material or different materials. Besides, each of the first insulating layer 381, the second insulating layer 382, the third insulating layer 383 and the passivation layer 385 may be made of any of a variety of materials that have insulation properties.

The light-emitting element 350 may be formed on a substrate by an epitaxial technique. It may be grown by forming a seed crystal layer for forming a semiconductor layer on a substrate and then depositing a desired semiconductor material. Hereinafter, the structure of the light-emitting element 350 according to various exemplary embodiments will be described in detail with reference to FIGS. 7 to 9.

Figure 7:
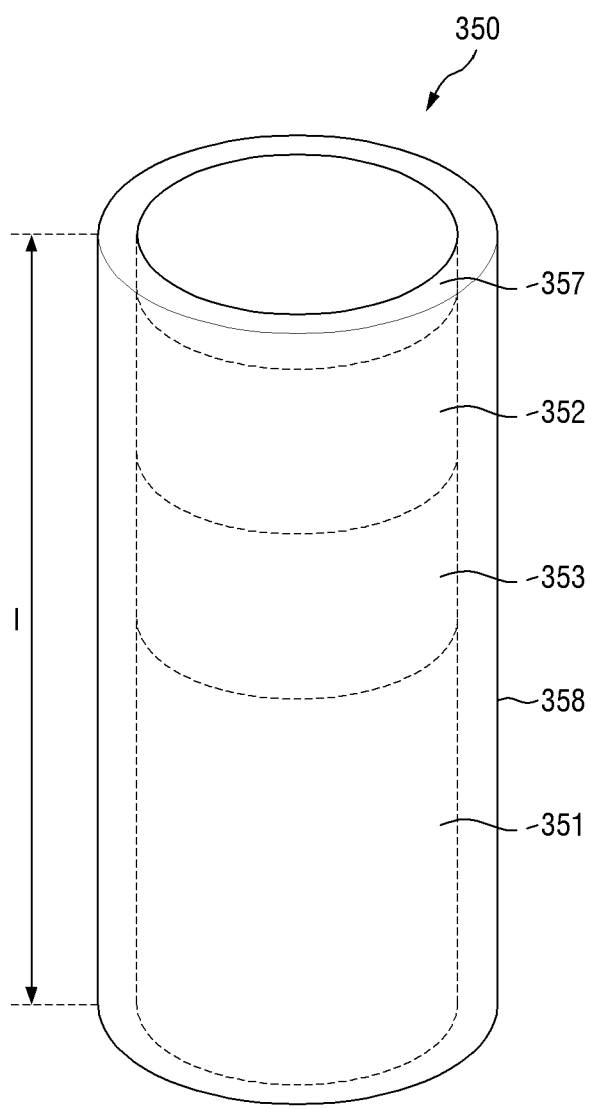
FIG. 7 is a view showing the light-emitting element according to an exemplary embodiment of the present disclosure.

FIG. 7 is a view showing the light-emitting element according to an exemplary embodiment of the present disclosure.

Referring to FIG. 7, the light-emitting element 350 may include a plurality of conductive material layers 351 and 352, an active material layer 353 disposed between the plurality of conductive material layers 351 and 352, an electrode material layer 357, and an insulating material layer 358. An electric signal applied from the first electrode 310 and the second electrode 320 may be transmitted to the active material layer 353 via the plurality of conductive material layers 351 and 352 to emit light.

Specifically, the light-emitting element 350 may include the first conductivity-type semiconductor layer 351, the second conductivity-type semiconductor layer 352, the active material layer 353 disposed between the first conductivity-type semiconductor layer 351 and the second conductivity-type semiconductor layer 352, the electrode material layer 357 disposed on the second conductive-type semiconductor layer 352, and the insulating material layer 358. In the light-emitting element 350 shown in FIG. 7, the first conductivity-type semiconductor layer 351, the active material layer 353, the second conductivity-type semiconductor layer 352 and the electrode material layer 357 are stacked on one another in the longitudinal direction in this order. It is, however, to be understood that the present disclosure is not limited thereto. The electrode material layer 357 may be eliminated. In some exemplary embodiments, it may be disposed on at least one of the first and second conductivity-type semiconductor layers 351 and 352. Hereinafter, the light-emitting element 350 of FIG. 7 will be described as an example.

The first conductivity-type semiconductor layer 351 may be an n-type semiconductor layer. For example, when the light-emitting element 350 emits light of a blue wavelength band, the first conductivity-type semiconductor layer 351 may be a semiconductor material having Formula below: $In_xAl_yGa_{1-x-y}N$ ($0 \le x \le 1$, $0 \le y \le 1$, $0 \le x+y \le 1$). For example, it may be at least one of n-type doped InAlGaN, GaN, AlGaN, InGaN, AlN and InN. The first conductivity-type semiconductor layer 351 may be doped with a first conductivity-type dopant. For example, the first conductivity-type dopant may be Si, Ge, Sn, etc. The length of the first conductivity-type semiconductor layer 351 may range, but is not limited to, from 1.5 μm to 5 μm.

The second conductivity-type semiconductor layer 352 may be a p-type semiconductor layer. For example, when the light-emitting element 350 emits light of a blue wavelength band, the first conductivity-type semiconductor layer 352 may be a semiconductor material having Formula below: $In_xAl_yGa_{1-x-y}N$ ($0 \le x \le 2$, $0 \le y \le 1$, $0 \le x+y \le 1$). For example, it may be at least one of p-type doped InAlGaN, GaN, AlGaN, InGaN, AlN and InN. The second conductivity-type semiconductor layer 352 may be doped with a second conductivity-type dopant. For example, the second conductivity-type dopant may be Mg, Zn, Ca, Se, Ba, etc. The length of the second conductivity-type semiconductor layer 352 may range, but is not limited to, from 0.08 μm to 0.25 μm.

The active material layer 353 may be disposed between the first conductivity-type semiconductor layer 351 and the second conductivity-type semiconductor layer 352 and may include a material having a single or multiple quantum well structure. When the active material layer 353 includes a material having the multiple quantum well structure, quantum layers and well layers may be alternately stacked in the structure. The active material layer 353 may emit light as electron-hole pairs are combined therein in response to an electrical signal applied through the first conductivity-type semiconductor layer 351 and the second conductivity-type semiconductor layer 352. For example, when the active material layer 353 emits light in the blue wavelength range, the active material layer 353 may include a material such as AlGaN and AlInGaN. In particular, when the active material layer 353 has the multiple quantum well structure in which the quantum layers and the well layers are stacked on one another alternately, the quantum layers may include AlGaN or AlInGaN, and the well layers may include materials such as GaN or AlGaN. It is, however, to be understood that the present disclosure is not limited thereto. The active material layer 353 may have a structure in which a semiconductor material having a large band gap energy and a semiconductor material having a small band gap energy are alternately stacked on one another, and may include other Group III to Group V semiconductor materials depending on the wavelength range of the emitted light. Accordingly, the light emitted from the active material layer 353 is not limited to the light of the blue wavelength band. The active material layer 353 may emit light of red or green wavelength band in some implementations. The length of the active material layer 353 may be, but is not limited to, in the range of 0.05 µm to 0.25 µm.

The light emitted from the active material layer 353 may exit through not only the outer surfaces of the light-emitting element 350 in the longitudinal direction but also through both side surfaces. That is to say, the direction in which the light emitted from the active material layer 353 propagates is not limited to one direction.

The electrode material layer 357 may be an ohmic contact electrode. It is, however, to be understood that the present disclosure is not limited thereto. The electrode material layer 357 may be a Schottky contact electrode. The electrode material layer 357 may include a metal having conductivity. For example, the electrode material layer 357 may include at least one of aluminum (Al), titanium (Ti), indium (In), gold (Au) and silver (Ag). The electrode material layer 357 may include the same material and may include different materials. It is, however, to be understood that the present disclosure is not limited thereto.

The insulating material layer 358 may be formed outside the light-emitting element 350 to protect it. For example, the insulating material layer 358 may be formed so as to surround the side surface of the light-emitting element 350, and not at both ends of the light-emitting element 350 in the longitudinal direction, for example, where the first conductivity-type semiconductor layer 351 and the second conductivity semiconductor layer 352 are disposed. It is, however, to be understood that the present disclosure is not limited thereto. The insulating material layer 358 may include materials having an insulating property such as silicon oxide (SiOx), silicon nitride (SiNx), silicon oxynitride (SiOxNy), aluminum nitride (AlN) and aluminum oxide ($Al_2O_3$). Accordingly, it is possible to prevent an electrical short-circuit that may be created when the active material layer 353 comes in contact with the first electrode 310 or the second electrode 320. In addition, because the insulating material layer 358 may include the active material layer 353 to protect the outer surface of the light-emitting element 350, it is possible to prevent a decrease in luminous efficiency.

The insulating material layer 358 may be extended in the longitudinal direction to cover from the first conductivity-type semiconductor layer 351 to the electrode material layer 357. It is, however, to be understood that the present disclosure is not limited thereto. The insulating material layer 358 may cover only the first conductivity-type semiconductor layer 351, the active material layer 353 and the second conductivity-type semiconductor layer 352 or only a part of the electrode material layer 357, such that the other part of the electrode material layer 357 may be exposed.

In some exemplary embodiments, the insulating material layer 358 may be subjected to a surface treatment so that it is dispersed in the solution without being agglomerated with another insulating material layer. During the process of aligning the light-emitting elements 350 to be described below, the light-emitting elements 350 remain dispersed in the solution to be independently aligned between the first electrode 310, the second electrode 320, and the third electrode 330. For example, the surface of the insulating material layer 358 may be treated to be hydrophobic or hydrophilic, so that it can remain dispersed in the solution.

The thickness of the insulating material layer 358 may be, but is not limited to, in the range of 0.5 µm to 1.5 µm.

The light-emitting element 350 may be cylindrical. It is to be understood that the shape of the light-emitting element 350 is not limited thereto but may have various shapes such as a cube, a rectangular cuboid and a hexagonal column. The length of the light-emitting element 350 may range from 1 µm to 10 µm or from 2 µm to 5 µm, and preferably approximately 4 µm. The diameter of the light-emitting element 350 may range from 410 nm to 700 nm, and preferably approximately 500 nm.

Hereinafter, a method of fabricating the display device 10 according to an exemplary embodiment of the present disclosure will be described with reference to FIGS. 8 to 10.

Figure 8:
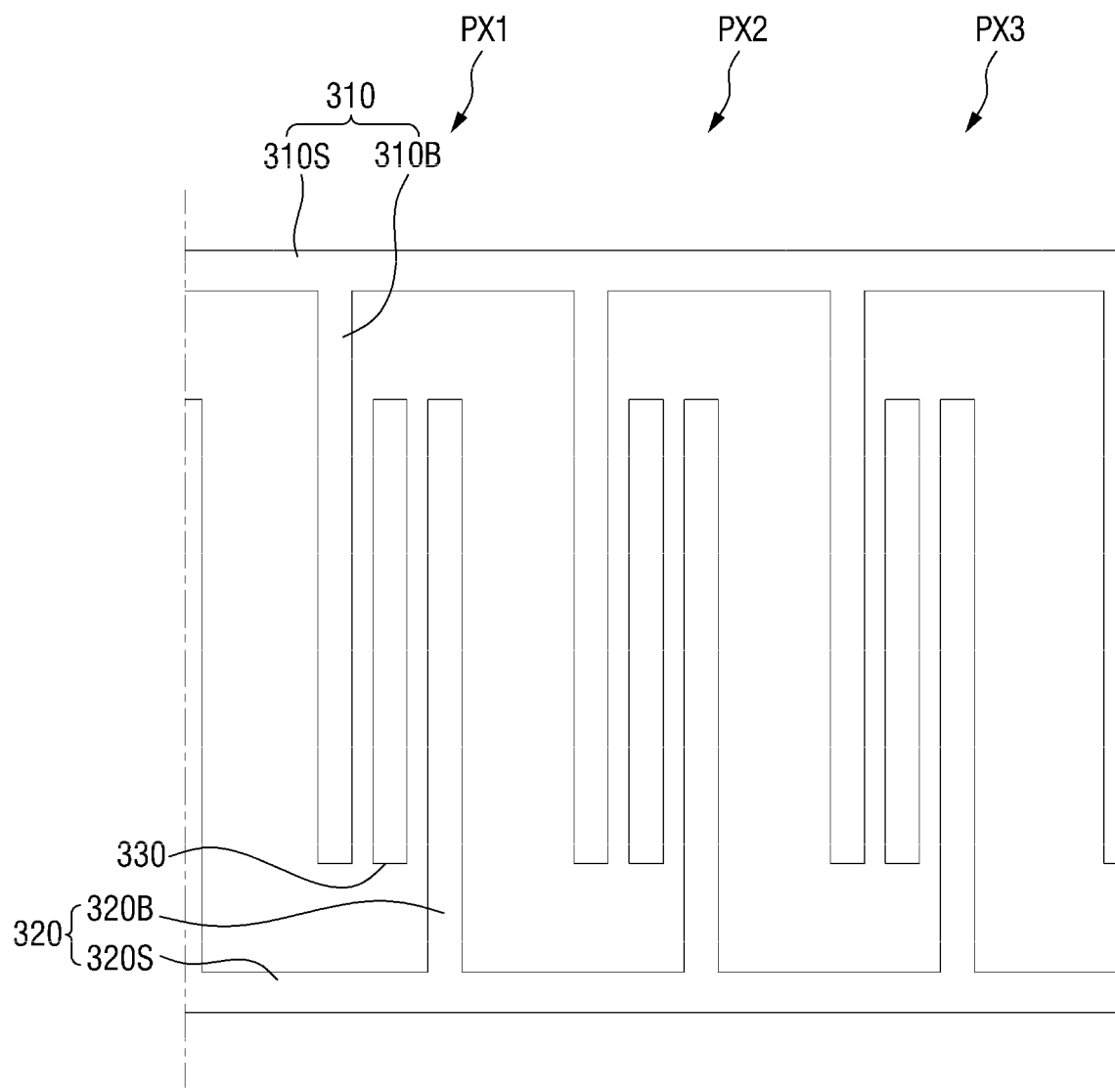
FIGS. 8 to 10 are plan views schematically showing a method of fabricating a display device according to an exemplary embodiment of the present disclosure.
Figure 9:
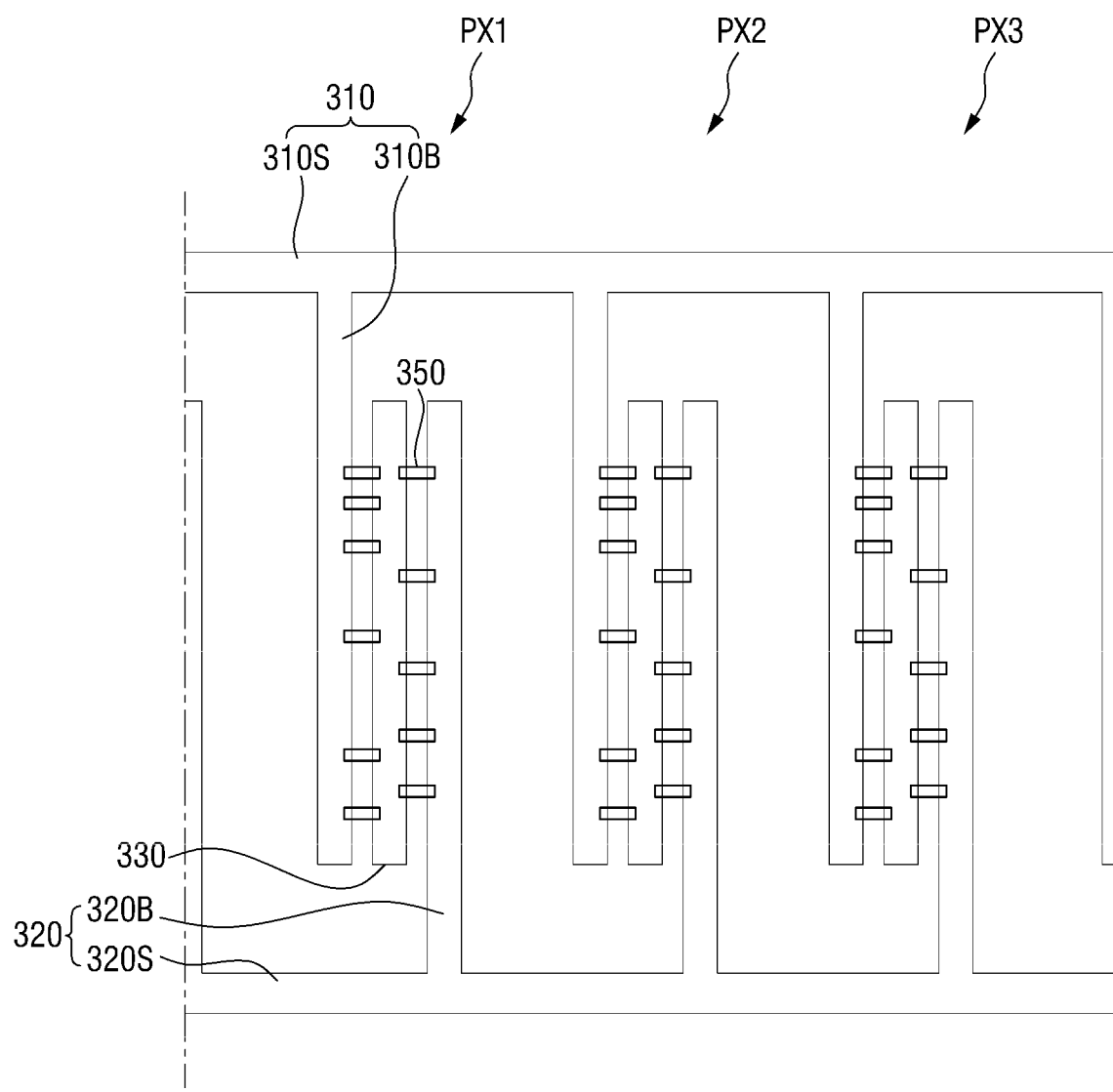
Figure 10:
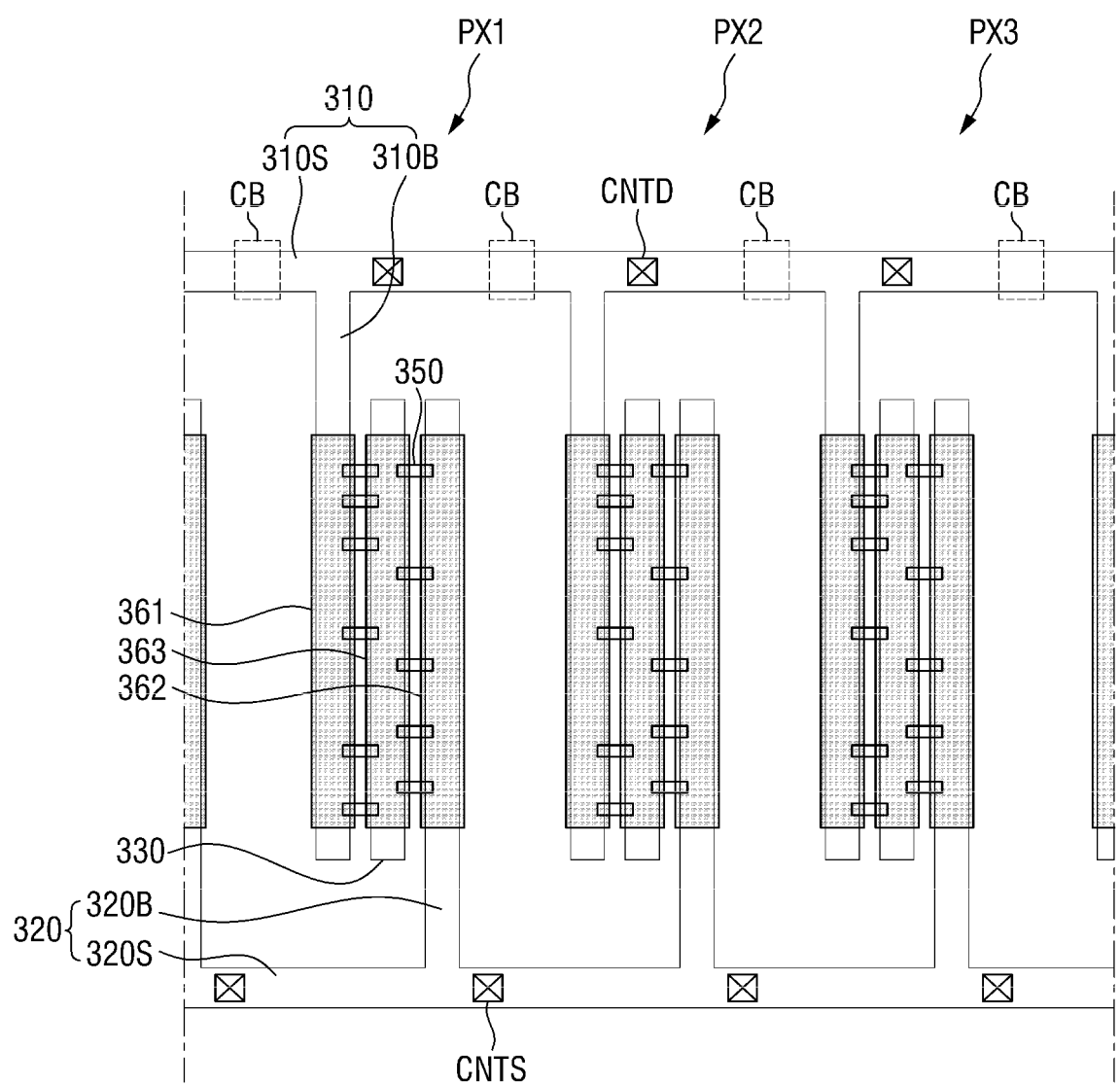

FIGS. 8 to 10 are plan views schematically showing a method of fabricating a display device according to an exemplary embodiment of the present disclosure.

Referring to FIG. 8, a plurality of electrodes 310, 320 and 330 are formed on an insulating substrate layer 300. The plurality of electrodes 310, 320 and 330 may be formed by patterning a metal or an organic material via a typical mask process.

As described above with reference to FIG. 1, the first electrode stem 310S and the second electrode stem 320S are extended in the first direction D1 and are spaced apart from and located opposite to each other. In FIG. 1, the first electrode stem 310S is electrically separated and spaced apart from one another from pixel to pixel PX. In contrast, in FIG. 8, one end of the first electrode stem 310S may be extended across the plurality of adjacent pixels PX. One end of each of the first electrode stem 310S and the second electrode stem 320S may be connected to a signal application pad PAD so that AC power may be applied to align the light-emitting element 350.

The first electrode branch 310B and the second electrode branch 320B branch off from the first electrode stem 310S and the second electrode stem 320S, respectively, and are extended in the second direction D2. As described above, the first electrode branch 310B and the second electrode branch 320B are extended in opposite directions to each other and are spaced apart from the second electrode stem 320S and the first electrode stem 310S, respectively.

The third electrode 330 is spaced apart from the first electrode branch 310B and the second electrode branch 320B and is extended in the second direction D2. As shown in FIG. 1, the third electrode 330 is substantially parallel to the first electrode branch 310B and the second electrode branch 320B. It is to be noted that because the third electrode 330 is electrically connected neither to the first electrode stem 310S nor to the second electrode stem 320S, the AC power applied from the signal application pad PAD may not be directly transmitted to it.

That is to say, the first electrode 310 and the second electrode 320 of FIG. 8 are substantially identical to those of FIG. 1 except that the first electrode stem 310S of each pixel PX is extended to be connected to the first electrode stem 310S of an adjacent pixel. The detailed description thereon will not be given.

Subsequently, referring to FIG. 9, the light-emitting elements 350 are arranged between the electrodes 310, 320 and 330.

Although not shown in the drawings, a solution including the light-emitting elements 350 is applied between the first electrode branch 310B and the second electrode branch 320B. Then, AC power is applied from the signal application pad PAD connected to one end of each of the first electrode stem 310S and the second electrode stem 320S to align the light-emitting elements 350.

The AC power applied from the signal application pad PAD may form a capacitance induced by an electric field between the first electrode branch 310B and the second electrode branch 320B. The light-emitting elements 350 in the applied solution may receive a dielectrophoresis force (DEP force) by the capacitance due to the electric field. The light-emitting elements 350 may be aligned between the first electrode branch 310B and the third electrode 330 and between the third electrode 330 and the second electrode branch 320B by the DEP force. As the light-emitting elements 350 receive the DEP force, one end of the light-emitting elements 350 is connected to the first electrode branch 310B or the second electrode branch 320B, and the other end of the light-emitting elements 350 is connected to the third electrode 330 on both sides.

The dielectrophoresis force applied to the light-emitting elements 350 by the capacitance may cause the light-emitting elements 350 to have a certain directionality between the electrodes 310, 320 and 330. For example, the first conductivity-type semiconductor layer 351 of the light-emitting elements 350 may be connected to the first electrode branch 310B or one side of the third electrode 330 close to the second electrode branch 320B, and the second conductivity-type semiconductor layer 352 may be connected to the second electrode branch 320B or the other side of the third electrode 330. It is, however, to be understood that the present disclosure is not limited thereto. The light-emitting elements 350 may be aligned in any direction between the electrodes 310, 320 and 330.

The arrangement of the light-emitting elements 350 have been described above with reference to FIG. 1.

Subsequently, referring to FIG. 10, after the light-emitting elements 350 are aligned between the electrodes 310, 320 and 330, contact electrodes 360 are formed on the electrodes 310, 320 and 330 and are brought into contact with the light-emitting elements 350. Although not shown in FIG. 10, a plurality of insulating layers may be disposed on the electrodes 310, 320 and 330, as shown in FIG. 4. As described above, the contact electrodes 360 may be in contact with both sides of each of the light-emitting elements 350 and the upper surface of each of the electrodes 310, 320 and 330 on the pixel-defining layers 410, 420 and 430, respectively.

Lastly, as shown in FIG. 10, the first electrode stem 310S is cut at the cutting portions CB so that it is electrically separated, such that the display device 10 of FIG. 1 can be fabricated. The method of electrically separating the first electrode stem 310S is not particularly limited. For example, the portions of the first electrode 310 located at the cutting portions CB may be cut using a laser. As a result, the first electrode stem 310S may be electrically separated and be spaced apart from one another between the neighboring pixels PX.

In addition, the first electrode 310 and the second electrode 312 may be electrically connected to the first thin-film transistor 120 and the power supply electrode 162 through the first electrode contact hole CNTD on the first electrode stem 310S and the second electrode contact hole CNTS on the second electrode stem 320S. Accordingly, a current caused by the driving voltage and the supply voltage may flow between the first electrode 310 and the second electrode 320, such that the light-emitting elements 350 arranged between the first electrode 310 and the third electrode 330 and between the third electrode 330 and the second electrode 320 may be connected in series.

As described above, in the display device 10 according to the exemplary embodiment of the present disclosure, the third electrode 330 is disposed between the first electrode branch 310B and the second electrode branch 320B, such that the light-emitting elements 350 may be aligned between the electrodes to be connected in series. Accordingly, when the display device 10 is driven, the voltage-dividing efficiency can be increased, the capacity of the thin-film transistors can be designed easily, and the loss due to the line resistance can be improved.

Figure 11:
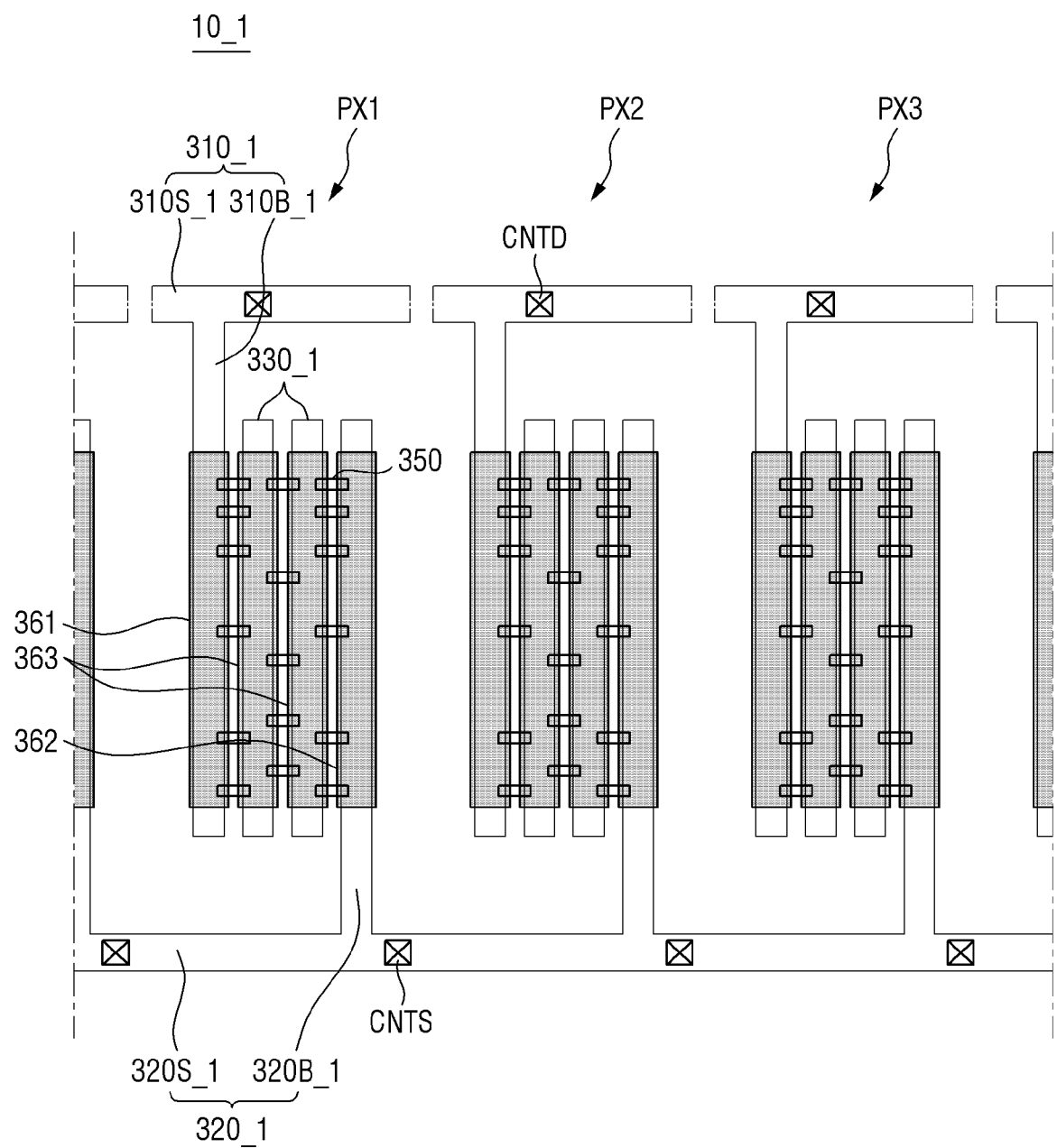
FIGS. 11 to 13 are plan views of a display device according to another exemplary embodiment of the present disclosure.
Figure 12:
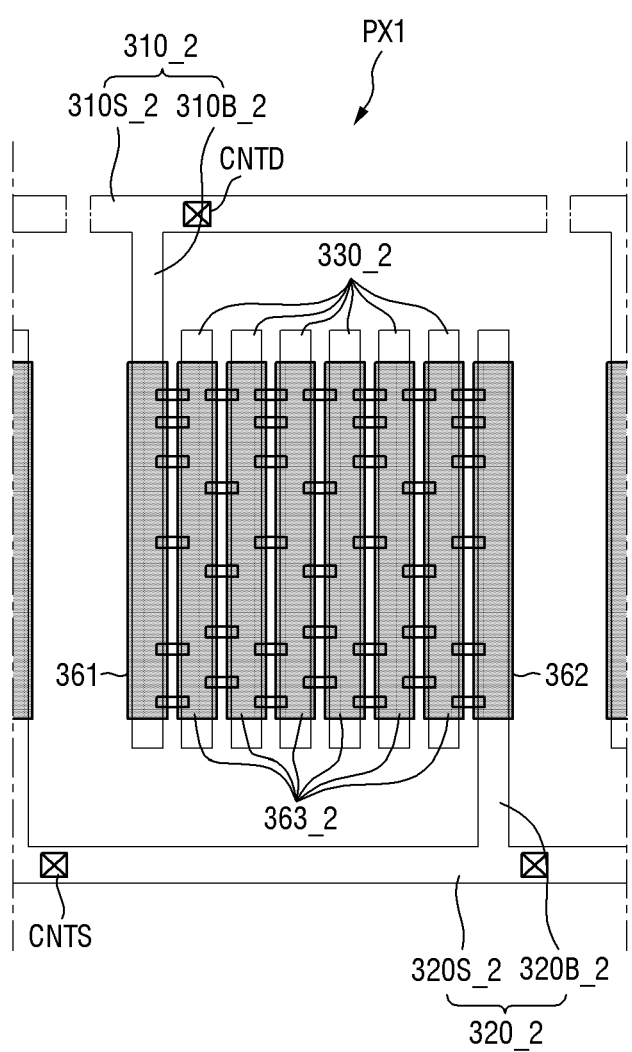
Figure 13:
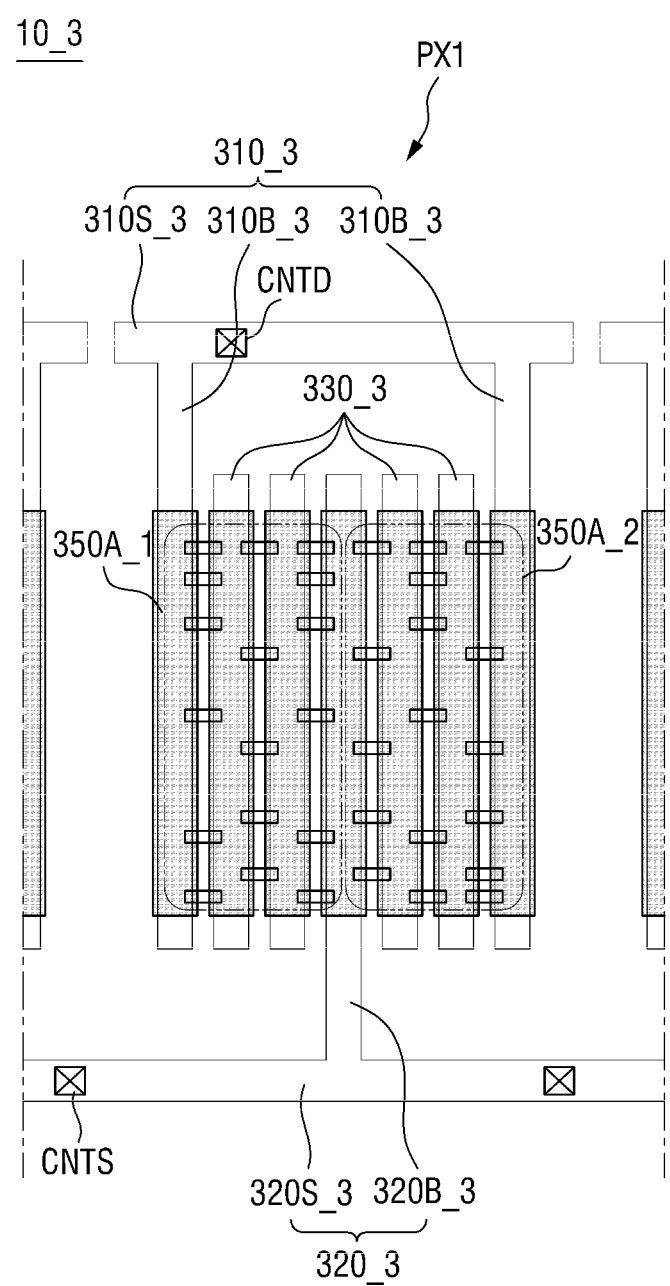

Hereinafter, a display device 10 according to another exemplary embodiment of the present disclosure will be described. FIGS. 11 to 13 are plan views of a display device according to another exemplary embodiment of the present disclosure.

Referring to FIGS. 11 and 12, the display device 10 may include a plurality of third electrodes 330 as described above. A display device 10_1 of FIG. 11 may include two third electrodes 330_1 between a first electrode branch 310B_1 and a second electrode branch 320B. Accordingly, the light-emitting elements 350 may be arranged between the first electrode 310_1 and the third electrode 330_1, between the third electrode 330_1 and the third electrode 330_1, and between the third electrode 330_1 and the second electrode 320_1. The number of the light-emitting elements 350 connected in series may be three. A display device 10_2 of FIG. 12 includes six third electrodes 330_2, and the number of the light-emitting elements 350 connected in series may be seven.

Compared to the display device shown in FIG. 1, the number of the light-emitting elements 350 connected in series may vary depending on the number of the third electrodes 330. When an odd number of the third electrode 330 are included in one pixel PX of the display device 10, there may be an even number of the light-emitting elements 350 connected in series in the pixel PX. On the other hand, when an even number of the third electrodes 330 are included, there may be an odd number of the light-emitting elements 350 connected in series.

In other words, when a pixel of the display device 10 includes n third electrodes 330, the number of the light-emitting elements 350 connected in series may be n+1. The number of the light-emitting elements 350 connected in series increases with the number of the third electrodes 330, and thus the voltage-dividing efficiency can be increased and the power loss due to the line resistance can be further improved.

FIG. 13 is a plan view of a display device according to yet another exemplary embodiment of the present disclosure.

Referring to FIG. 13, a display device 10_3 may include one second electrode 320_3 and two first electrodes 310_3 spaced apart from each other, and the second electrode 320_3 may be disposed between the first electrodes 310_3. A plurality of third electrodes 330_3 may be disposed between the first electrodes 310_3 and the second electrode 320_3.

Although FIG. 13 shows an example where two third electrodes 330_3 are disposed between the first electrodes 310_3 and the second electrode 320_3, the present disclosure is not limited thereto.

Specifically, the display device 10_3 may include a plurality of first electrode branches 310B_3 branching off from the first electrode stem 310S_3. Although two first electrode branches 310B_3 are spaced apart from each other in one pixel PX in the example shown in FIG. 13, the present disclosure is not limited thereto. A greater number of first electrode branches 310B_3 may branch off from it.

One second electrode branch 320_B may branch off from the second electrode stem 310S_3 in one pixel PX. The second electrode branch 320B_3 may be disposed between the two first electrode branches 310B_3 and may be equally spaced apart from them. In other words, the second electrode branch 320B_3 may be disposed at the center between the first electrode branches 310B_3 spaced apart from each other. Accordingly, one pixel PX of the display device 10_3 may have a laterally symmetrical structure with respect to the second electrode branch 320B_3. It is, however, to be understood that the present disclosure is not limited thereto. The second electrode branch 320B_3 may be disposed closer to one of the first electrode branches 310B_3, such that the structure of the pixel may not be symmetrical.

The third electrodes 330_3 may be disposed between the second electrode branch 320B_3 and the two first electrode branches 310B_3. FIG. 13 shows that two third electrode branches 330B_3 are disposed on either side of the second electrode branch 320B_3 such that four third electrodes 330_3 are disposed in one pixel PX. It is, however, to be understood that the present disclosure is not limited thereto. It is to be understood that a greater number of third electrodes 330_3 may be disposed.

The light-emitting elements 350 may be disposed between the first electrode branches 310B_3 and the third electrodes 330_3, between the third electrodes 330_3, and between the third electrodes 330_3 and the second electrode branch 320B_3. For convenience of illustration, in FIG. 13, the light-emitting elements disposed between the first electrode branch 310B_3 and the third electrodes 330_3 disposed on the left side of the second electrode branch 320B_3 and between the third electrodes 330_3 and the second electrode branch 320B_3 are referred to as a first light-emitting element alignment. The light-emitting elements disposed between the first electrode branch 310B_3 and the third electrodes 330_3 disposed on the right side of the second electrode branch 320B_3 and between the third electrodes 330_3 and the second electrode branch 320B_3 are referred to as a second light-emitting element alignment.

Because one or more third electrodes 330_3 are disposed on the left side of the second electrode branch 320B_3, the first light-emitting element alignment 350A_1 may include one or more light-emitting element alignments. Because one or more third electrodes 330_3 are disposed on the right side of the second electrode branch 320B_3, the second light-emitting element alignment 350A_2 may include one or more light-emitting element alignments. In each of the first light-emitting element alignment 350A_1 and the second light-emitting element alignment 350A_2, one or more light-emitting elements may be connected in series. A current can flow from the first electrode branch 310B_3 to the second electrode branch 320B_3 via the third electrodes 330_3 in the light-emitting element alignment connected in series.

On the other hand, the first light-emitting element alignment 350A_1 and the second light-emitting element alignment 350A_2 disposed on the left and right sides of the second electrode branch 320B_3, respectively, may be connected to each other in parallel. Because the current flows from different first electrode branches 310B_3 to the same second electrode branch 320B_3 in each of the first light-emitting element alignment 350A_1 and the second light-emitting element alignment 350A_2, they may be connected in parallel. In other words, according to this exemplary embodiment of the present disclosure, the display device 10_3 may have the light-emitting element alignment of a series-parallel structure. As described above, the third electrodes 330 may be substantially identical to the first electrode branches 310B or the second electrode branch 320B. In some exemplary embodiments, the third electrodes 330 may be formed by electrically separating the first electrode branches 310B and the second electrode branches 320B from the first electrode stem 310S and the second electrode stem 320S, respectively. More detailed description thereon will be given with reference to FIGS. 14 and 19.

Figure 14:
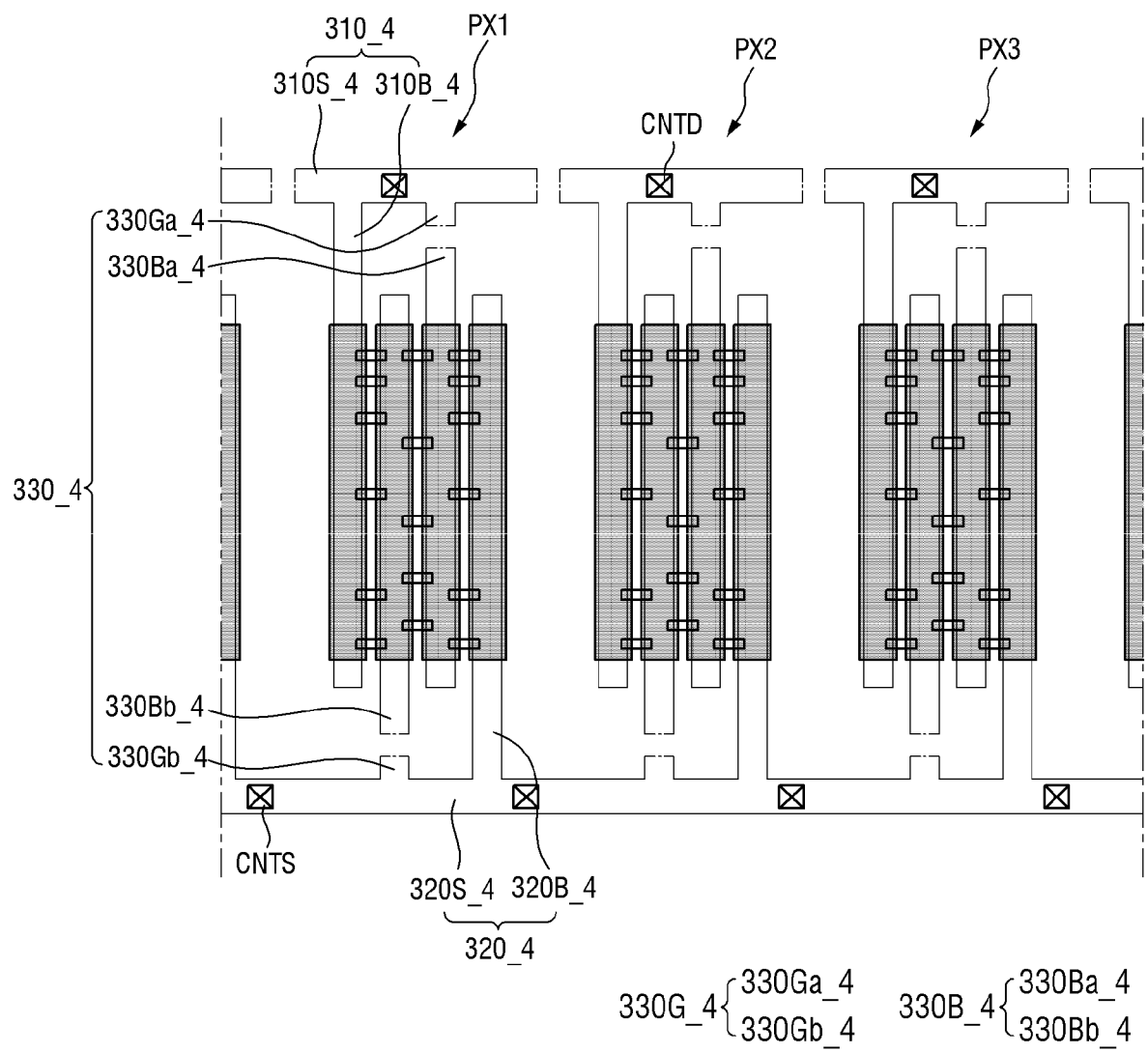
FIG. 14 is a plan view of a display device according to yet another exemplary embodiment of the present disclosure.

FIG. 14 is a plan view of a display device according to yet another exemplary embodiment of the present disclosure.

Referring to FIG. 14, a display device 10_4 may include a first electrode stem 310S_4, a second electrode stem 320S_4, a first electrode branch 310B_4, a second electrode branch 320B_4, and a third electrode 330_4. The arrangements and structures of the first electrode stem 310S_4, the second electrode stem 320S_4, the first electrode branch 310B_4 and the second electrode branch 320B_4 are identical to those described with reference to FIG. 1. The following description will focus on differences.

The third electrode 330_4 may include a third electrode branch 330B_4 and a third electrode fragment 330G_4.

The third electrode fragment 330G_4 may include the (3−1)th electrode fragment 330Ga_4 branching off from the first electrode stem 310S_4 and terminated while being spaced apart from the third electrode branch 330B_4, and the (3−2)th electrode fragment 330Gb_4 branching off from the second electrode stem 320S_4 and terminated while being spaced apart from the third electrode branch 330B_4.

The third electrode branch 330B_4 may include the (3−1)th electrode branch 330Ba_4 spaced apart from the (3−1)th electrode fragment 330Ga_4 and extended in the second direction D2 to be aligned with the (3−1)th electrode fragment 330Ga_4, and the (3−2)th electrode branch 330Bb_4 spaced apart from the (3−2)th electrode fragment 330Gb_4 and extended in the second direction D2 to be aligned with the (3−2)th electrode fragment 330Gb_4.

In summary, the (3−1)th electrode branch portion 330Ba_4 may be extended in the second direction D2 and may be terminated while being spaced apart from the (3−1)th electrode fragment 330Ga_4 and the second electrode stem 320S_4. The (3−1)th electrode branch 330Ba_4 and the (3−1)th electrode fragment 330Ga_4 may be extended and aligned with each other. The (3−2)th electrode branch 330Bb_4 may be extended in the second direction D2 and may be terminated while being spaced apart from the (3−2)th electrode fragment 330Gb_4 and the first electrode stem 310S_4. The (3−2)th electrode branch 330Bb_4 and the (3−2)th electrode fragment 330Gb_4 may be extended and aligned with each other.

The third electrode 330_4 may be formed by being disposed and extended in the second direction D2 from the first electrode stem 310S_4 and the second electrode stem 320S_4 and then electrically separated from the first electrode stem 310S_4 and the second electrode stem 320S_4 by a laser or the like. That is to say, the third electrode 330_4 may be substantially identical to the first electrode branch 310B_4 and the second electrode branch 320B_4, but may be electrically separated from the electrode stems 310S_4 and 320S_4.

The display device 10_4 of FIG. 14 is different from the display device 10 of FIG. 1 in that the third electrode 330_4 may further include the electrode fragments 330Ga_4 and 330Gb_4 branching off from the first electrode stem 310S_4 and the second electrode stem 320S_4. That is to say, the (3-1)th electrode branch 330Ba_4 and the (3-1)th electrode fragment 330Ga_4 may be formed by electrically separating the first electrode branch 310B_4 from the first electrode stem 310S_4. The (3-2)th electrode branch 330Bb_4 and the (3-2)th electrode fragment 330Gb_4 may be formed by electrically separating the second electrode branch 320B_4 from the second electrode stem 320S_4.

It is, however, to be understood that the present disclosure is not limited thereto. All of the third electrodes 330_4 may be formed by electrically separating the first electrode branch 310B_4 or the second electrode branch 320B_4 from the electrode stems 310S_4 and 320S_4, respectively.

The electrode branches of each of the pixels PX may be arranged in parallel in the first direction D1, but the ends thereof may not be aligned with one another. For example, one end of the (3-1)th electrode branch 330Ba_4 may protrude in the second direction D2 from one end of each of the second electrode branch 320B_4 and the (3-2)th electrode branch 330Bb_4. On the contrary, one end of the (3-2)th electrode branch 330Bb_4 may protrude in the second direction D2 from one end of each of the first electrode branch 310B_4 and the (3-1)th electrode branch 330Ba_4. That is to say, the plurality of electrode branches disposed in each pixel PX may include a region that is not overlapped with the region overlapping in the first direction D1 but is partially protruded. The electrode branches of each of the pixels PX may be arranged in parallel in the first direction D1, but the ends thereof may not be aligned with one another. For example, one end of the (3-1)th electrode branch 330Ba_4 may protrude in the second direction D2 from one end of each of the second electrode branch 320B_4 and the (3-2)th electrode branch 330Bb_4. On the contrary, one end of the (3-2)th electrode branch 330Bb_4 may protrude in the second direction D2 from one end of each of the first electrode branch 310B_4 and the (3-1)th electrode branch 330Ba_4. That is to say, the plurality of electrode branches disposed in each pixel PX may include a region that is not overlapped with the region overlapping in the first direction D1 but is partially protruded. It is, however, to be understood that the present disclosure is not limited thereto. When the (3-1)th electrode branch 330Ba_4 and the (3-2)th electrode branch 330Bb_4 are formed, the region cut off from the first electrode stem 310S_4 and the second electrode stem 320S_4 may be adjusted, so that the both ends of each of the electrode branches may be aligned with each other.

The light-emitting elements 350 may be arranged between the first electrode branch 310B_4 and the (3-2)th electrode branch 330Bb_4, between the (3-2)th electrode branch 330Bb_4 and the (3-1)th electrode branch 330Ba_4, and between the (3-1)th electrode branch 330Ba_4 and the second electrode branch 320B_4. The light-emitting elements 350 arranged between the electrode branches may be connected in series, so that they can emit light as a current flows in the first electrode branch 310B_4, the (3-2)th electrode branch 330Bb_4, the (3-1)th electrode branch 330Ba_4, and the second electrode branch 320B_4.

Figure 15:
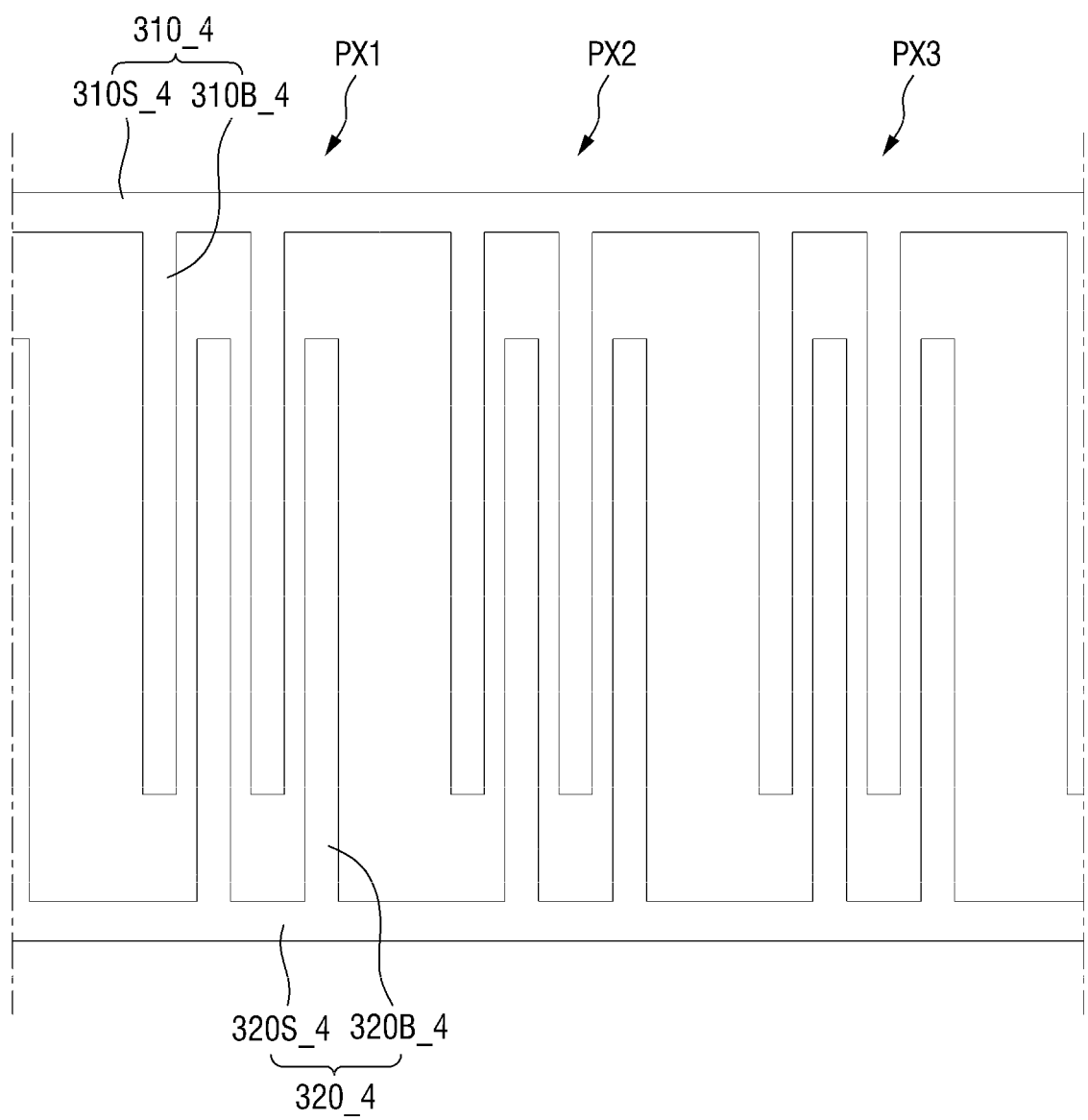
FIGS. 15 to 17 are plan views for illustrating a method of fabricating the display device of FIG. 14.
Figure 16:
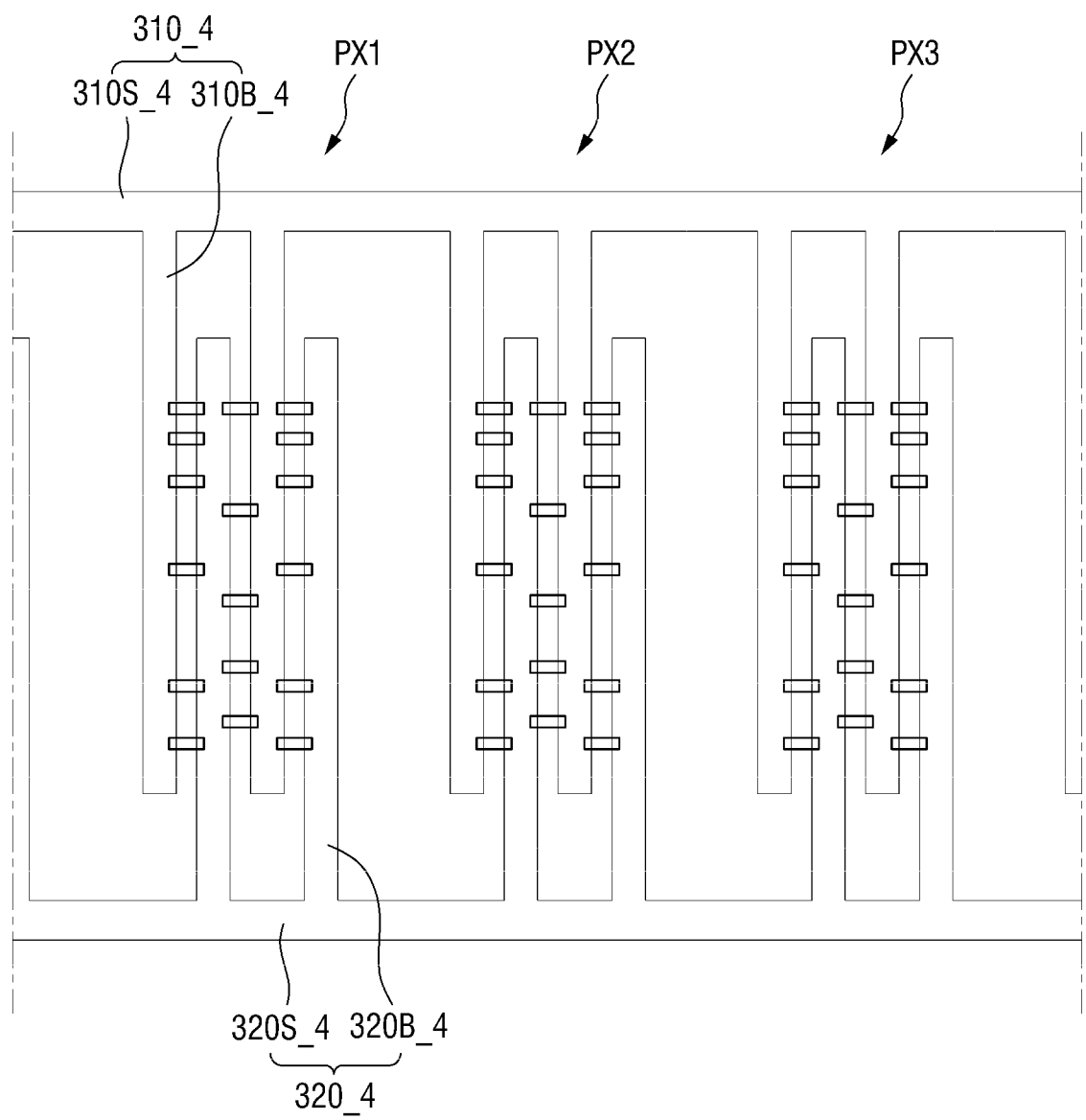
Figure 17:
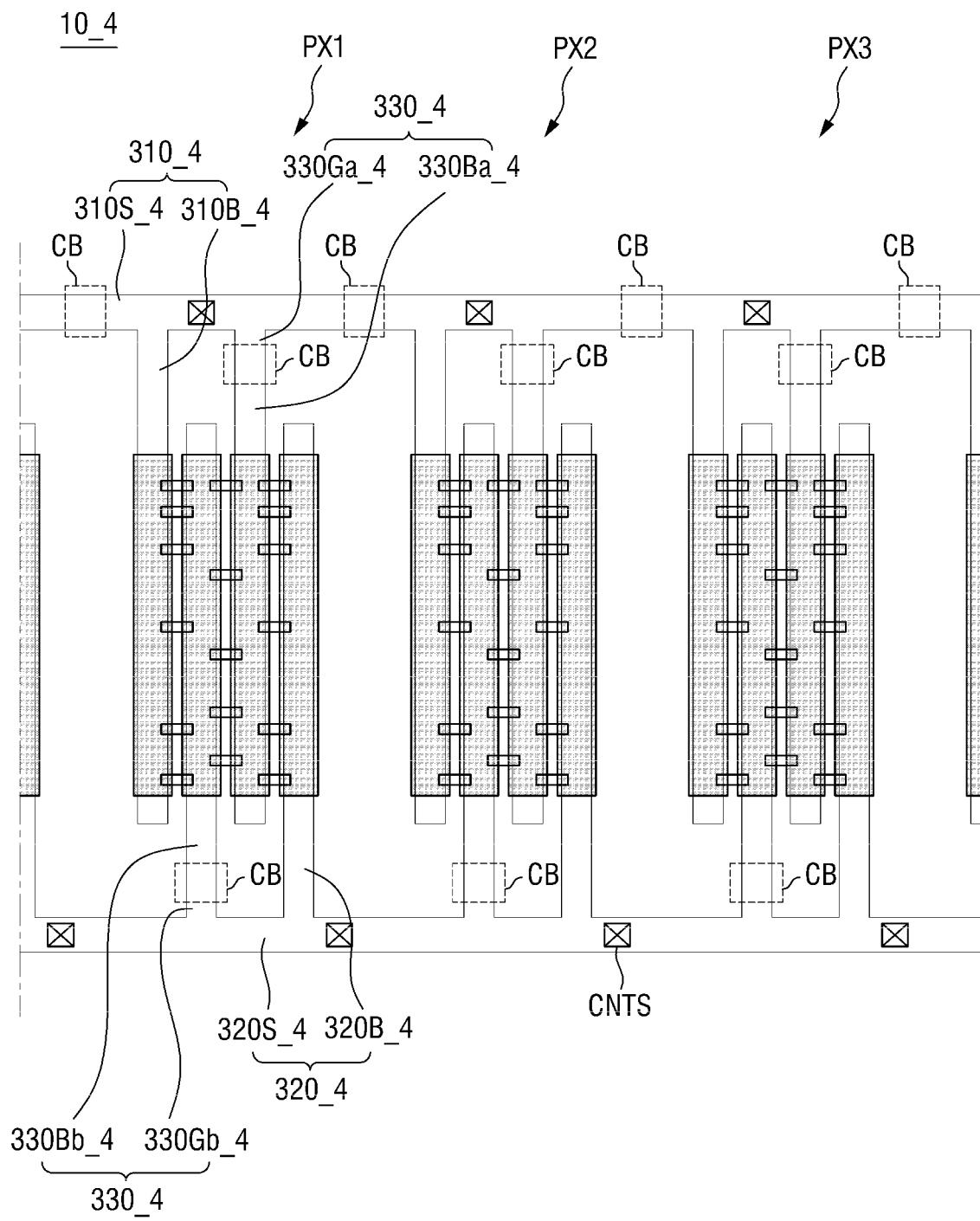

FIGS. 15 to 17 are plan views for illustrating a method of fabricating the display device of FIG. 14.

Initially, referring to FIG. 15, in a display device 10_4, a plurality of electrodes, e.g., a first electrode 310_4 and a second electrode 320_4 formed on an insulating substrate layer 300. The first electrode 310_4 and the second electrode 320_4 include electrode stems 310S_4 and 320S_4 and electrode branches 310B_4 and 320B_4, respectively.

Although FIG. 15 shows two first electrode branches 310B_4 and two second electrode branches 320B_4, the present disclosure is not limited thereto. The arrangements and structures of the first electrode stem 310S_4, the second electrode stem 320S_4, the first electrode branches 310B_4 and the second electrode branches portion 320B_4 are identical to those described with reference to FIG. 14. At least some of the first electrode branches 310B_4 and the second electrode branches 320B_4 may be used to form third electrode fragment 330B_4 and third electrode fragment 330G_4 via a subsequent process to be described below.

Subsequently, referring to FIG. 16, the light-emitting elements 350 are arranged between the electrode branches 310B_4 and 320B_4. A detailed description thereon is substantially identical to that given above with reference to FIG. 9; and, therefore, the redundant description will be omitted.

Subsequently, referring to FIG. 17, the first electrode stem 310S_4, the second electrode stem 320S_4, the first electrode branch 310B_4 and the second electrode branch 320B_4 are cut at the cutting portions CB thereon. The first electrode branch 310B_4 and the second electrode branch 320B_4 electrically separated at the cutting portions CB may form the third electrode branch 330B_4 and the third electrode fragment 330G_4. Unlike the example shown in FIG. 10, in the example shown in FIG. 17, the first electrode branch 310B_4 and the second electrode branch 320B_4 are also electrically disconnected at the cutting portions CB. That is to say, the third electrode 330_4 may be produced by forming a separate electrode or line, and the first electrode branch 310B_4 and the second electrode branch 320B_4 may be formed by cutting from the electrode stems 310S_4 and 320S_4. For example, the first electrode branch 310B_4 and the second electrode branch 320B_4 located on the outer side with respect to the center of the pixel PX may be electrically connected to the first electrode stem 310S_4 and the second electrode stem 320S_4, respectively, to receive electric signals directly from them. On the other hand, the first electrode branch 310B_4 and the second electrode branch 320B_4 located on the inner side with respect to the center of the pixel PX are electrically separated from the first electrode stem 310S_4 and the second electrode stem 320S_4, respectively, to form the third electrode branches 330B_4. In such a case, the third electrode fragments 330G_4 branching off from the first electrode stem 310S_4 and the second electrode stem 320S_4 may be formed together. It is, however, to be understood that the present disclosure is not limited thereto. The third electrode fragments 330G_4 may be eliminated depending on the way how the electrodes are cut.

In addition, the first electrode 310_4 and the second electrode 320_4 may be electrically connected to the first thin-film transistor 120 and the power supply electrode 162 through the first electrode contact hole CNTD on the first electrode stem 310S and the second electrode contact hole CNTS on the second electrode stem 320S.

Hereinafter, a display device according to yet another exemplary embodiment of the present disclosure will be described.

Figure 18:
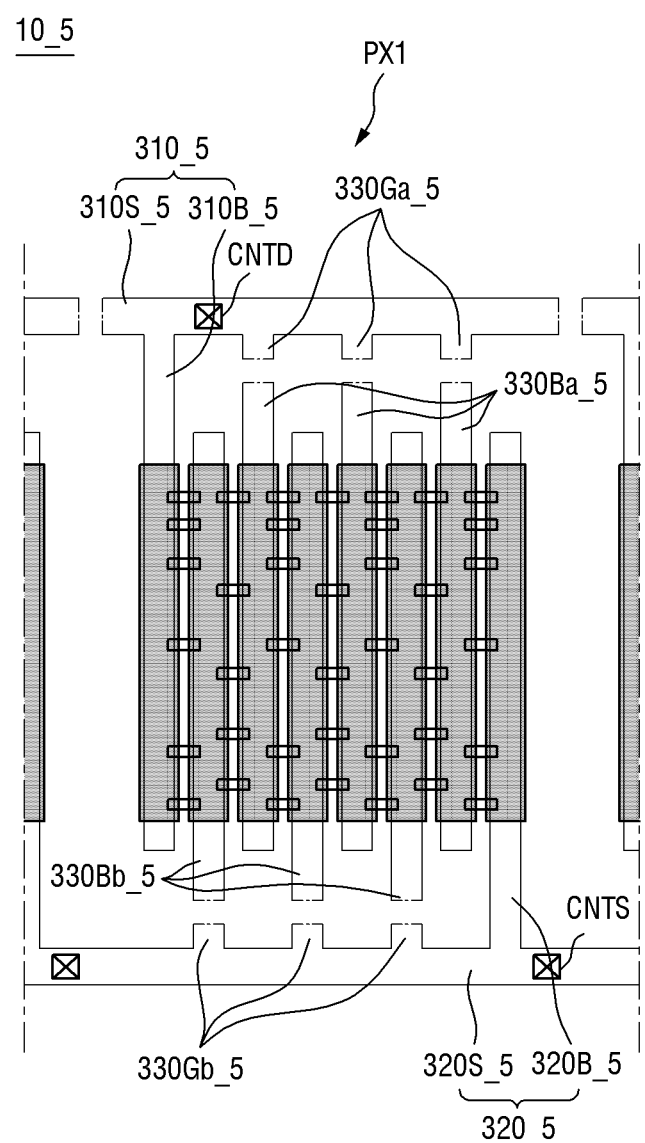
FIGS. 18 and 19 are plan views of a display device according to another exemplary embodiment of the present disclosure.
Figure 19:
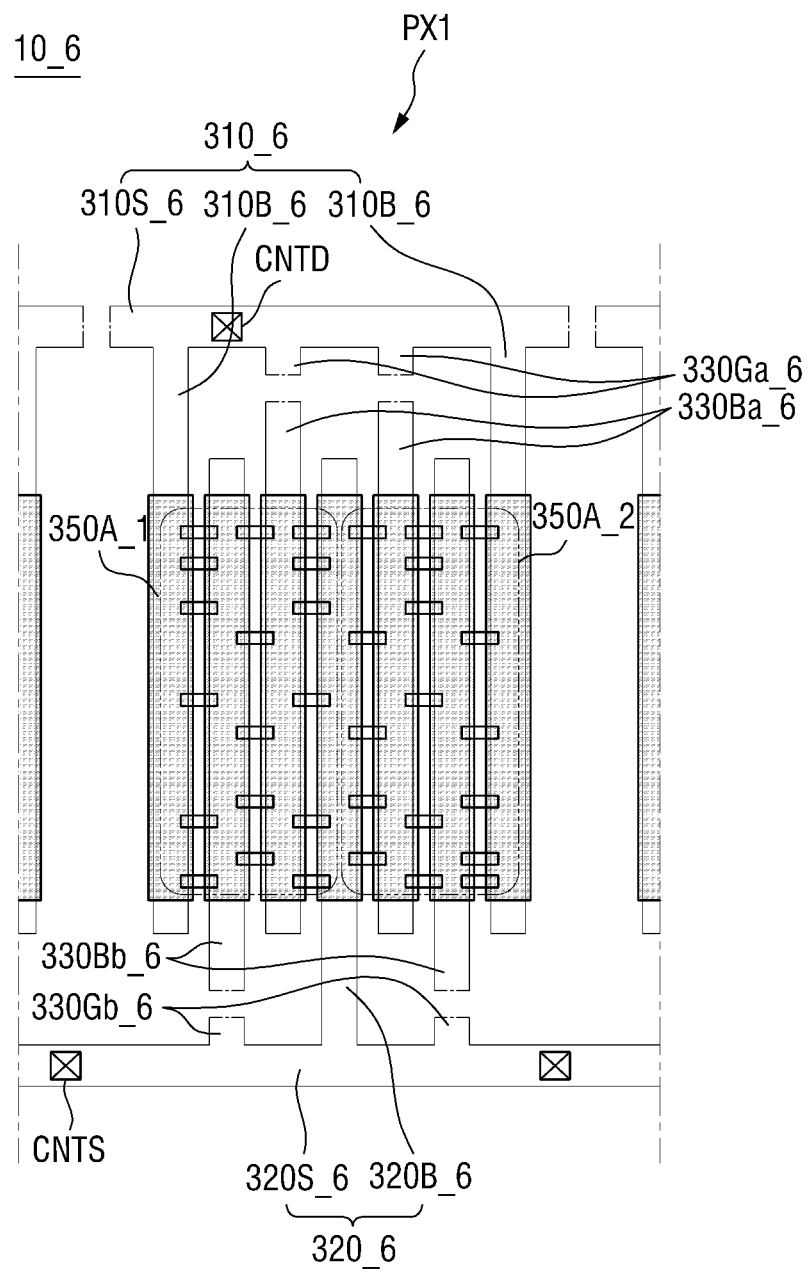

FIGS. 18 and 19 are plan views of a display device according to another exemplary embodiment of the present disclosure.

Referring to FIG. 18, there may be a plurality of electrodes 330, as described above. A display device 10_5 of FIG. 18 is identical to the display device 10_4 of FIG. 14 except that a greater number of the third electrode branches 330B_5 and a greater number of the third electrode fragments 330G_5 are disposed. In FIG. 18, a pixel of the display device 10_5 may include six third electrode branches parts 330B_5, and accordingly seven light-emitting elements 350 are connected in series. As the number of the aligned light-emitting elements 350 increases, the voltage-dividing efficiency of the display device and the power loss due to the line resistance can be improved, as described above. The display device 10_5 in FIG. 18 will not be described because the display device 10_4 in FIG. 14 is identical to the display device 10_2 in FIG. 11.

Referring to FIG. 19, a display device 10_6 includes one more first electrode branch 310B_6 than the display device 10_4 of FIG. 14, and the electrodes of the display device 10_6 have a symmetric structure with respect to the second electrode branch 320B_6. Accordingly, each of the first light-emitting element alignment 350A_1 located on the left side of the second electrode branch 320B_6 and the second light-emitting element alignment 350A_2 located on the right side of the second electrode branch 320B_6 may include light-emitting element arrangement connected in series and may be connected to each other in parallel. A detailed description thereon is identical to that given above with reference to FIG. 12.

Incidentally, as mentioned earlier, the first electrode 310 and the second electrode 320 may be utilized as lines via which an AC power for aligning the light-emitting elements 350 is applied. In addition, a power for driving the display device 10 may be applied via the electrodes so that an electric signal may be applied to the light-emitting elements 350. It is, however, to be understood that the present disclosure is not limited thereto. At least one of the first electrode 310 and the second electrode 320 may have different lines, one in which AC power is applied for aligning the light emitting device 350 and another one in which the power for driving the display device 10 is applied. This will be described in detail below.

Figure 20:
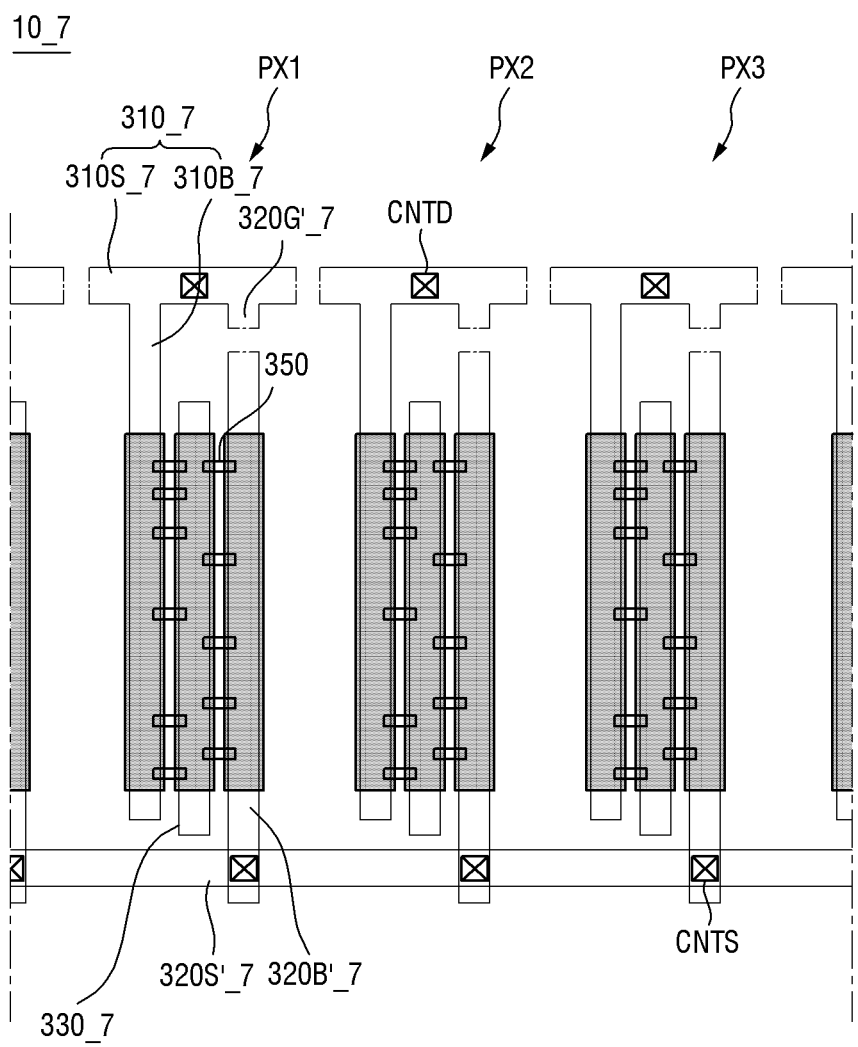
FIG. 20 is a plan view of a display device according to yet another exemplary embodiment of the present disclosure.

FIG. 20 is a plan view of a display device according to yet another exemplary embodiment of the present disclosure.

Referring to FIG. 20, a first electrode 310_7 of a display device 10_7 includes a first electrode stem 310S_7 and a first electrode branch 310B_7 branching off from the first electrode stem 310S_7. The first electrode stem 310S_7 and the first electrode branch 310B_7 are identical to those of the display device 10 of FIG. 1 and the display device 10_4 of FIG. 14 described above. The detailed description thereon will be omitted.

A second electrode 320 may include a second electrode branch 320B'_7, a second electrode fragment 320G'_7, and a second electrode line 320S'_7. Unlike the example shown in FIG. 1, in the display device 10_7 of FIG. 20, the second electrode branch 320B'_7 branches off from the first electrode stem 310S_7 and is electrically separated via a process to be described later. That is to say, during the process of fabricating the display device 10_7, the first electrode branch 310B_7 is separated from the first electrode stem 310S_7, so that the second electrode branch 320B'_7 and the second electrode fragment 320G'_7 may be formed. It is, however, to be understood that the present disclosure is not limited thereto. The second electrode branch 320B'_7 may be formed from a separate line or electrode.

The second electrode branch 320B'_7 may be extended in the second direction D2 and may be spaced apart from the first electrode branch 320B_7. One end of the second electrode branch 320B'_7 is spaced apart from the second electrode fragment 320G'_7, and the other end of the second electrode branch 320B'_7 may be electrically connected to the second electrode line 320S'_7 extended in the first direction D1.

The second electrode fragment 320G'_7 may protrude from the first electrode stem 310S_7 in the second direction D2. The second electrode fragment 320G'_7 may be disposed to face the terminated end of the second electrode branch 320B'_7. That is to say, the second electrode branch 320B'_7 and the second electrode fragment 320G'_7 may be aligned with each other in the second direction D2.

The third electrode 330_7 is disposed between the first electrode branch 310B_7 and the second electrode branch 320B'_7. The arrangement and structure of the third electrode 330_7 are identical to those described above with respect to FIGS. 1 and 14. It is to be noted that the third electrode 330_7 may be formed by electrically separating the second electrode branch 320B_7 from the second electrode stem 320B_7 (see FIG. 21) during the process of fabricating the display device 10_7, as will be described later.

The second electrode line 320S'_7 may be extended in the first direction D1 and may be spaced apart from the first electrode stem 320S_7. Although not shown in FIG. 20, the second electrode line 320S'_7 may be disposed in different line layers from the first electrode stem 310S_7. Accordingly, the second electrode line 320S'_7 may be electrically connected to the second electrode branch 320B'_7 through a second electrode contact hole CNTS. The second electrode line 320S'_7 may be connected to the power supply line 161 described above, and may apply the supply voltage to the second electrode branch 320B'_7. On the other hand, the second electrode stem 320S_7 (see FIG. 21) may be applied with an AC voltage for aligning the light-emitting elements 350 during the process of fabricating the display device 10_7. That is to say, the display device 10_7 may include two different lines, i.e., the second electrode line 320S'_7 and the second electrode stem 320S_7 to thereby apply different voltages.

The light-emitting elements 350 may be disposed between the first electrode branch 310B_7 and the third electrode 330_7 and between the third electrode 330_7 and the second electrode branch 320B'_7. Some of the light-emitting elements 350 may have one ends electrically connected to the first electrode branch 310B_7 and the other ends connected to the third electrode 330_7. The other of the light-emitting elements 350 may have one ends connected to an electrode 330_7 and the other ends electrically connected to the second electrode branch 320B'_7. Accordingly, the light-emitting elements 350 may be connected in series between the first electrode branch 310B_7 and the second electrode branch 320B'_7. The light-emitting elements 350 may receive a supply voltage from the first electrode stem 310S_7 connected to the first thin-film transistor 120 through the first electrode contact hole CNTD and the second electrode branch 320B'_7 connected to the power supply electrode 162 of the second electrode line 320S'_7 through the second electrode contact hole CNTS.

Figure 21:
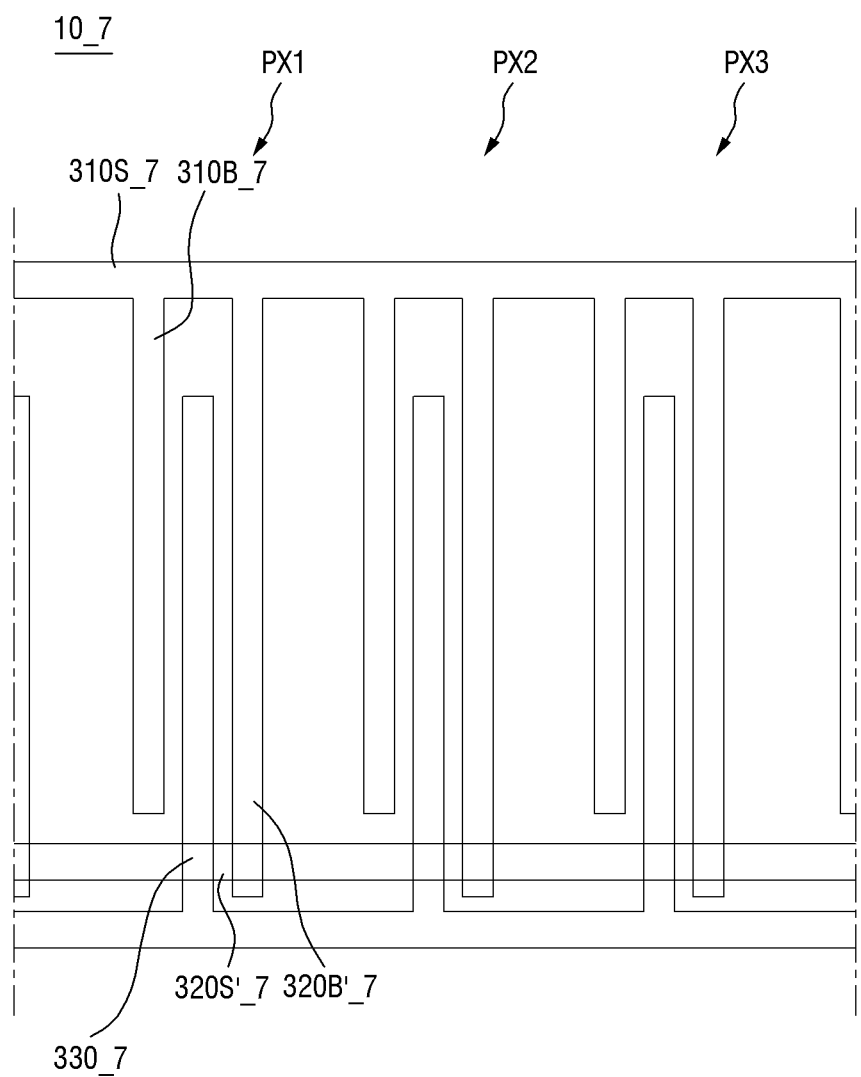
FIGS. 21 to 23 are plan views for illustrating a method of fabricating the display device of FIG. 20.
Figure 22:
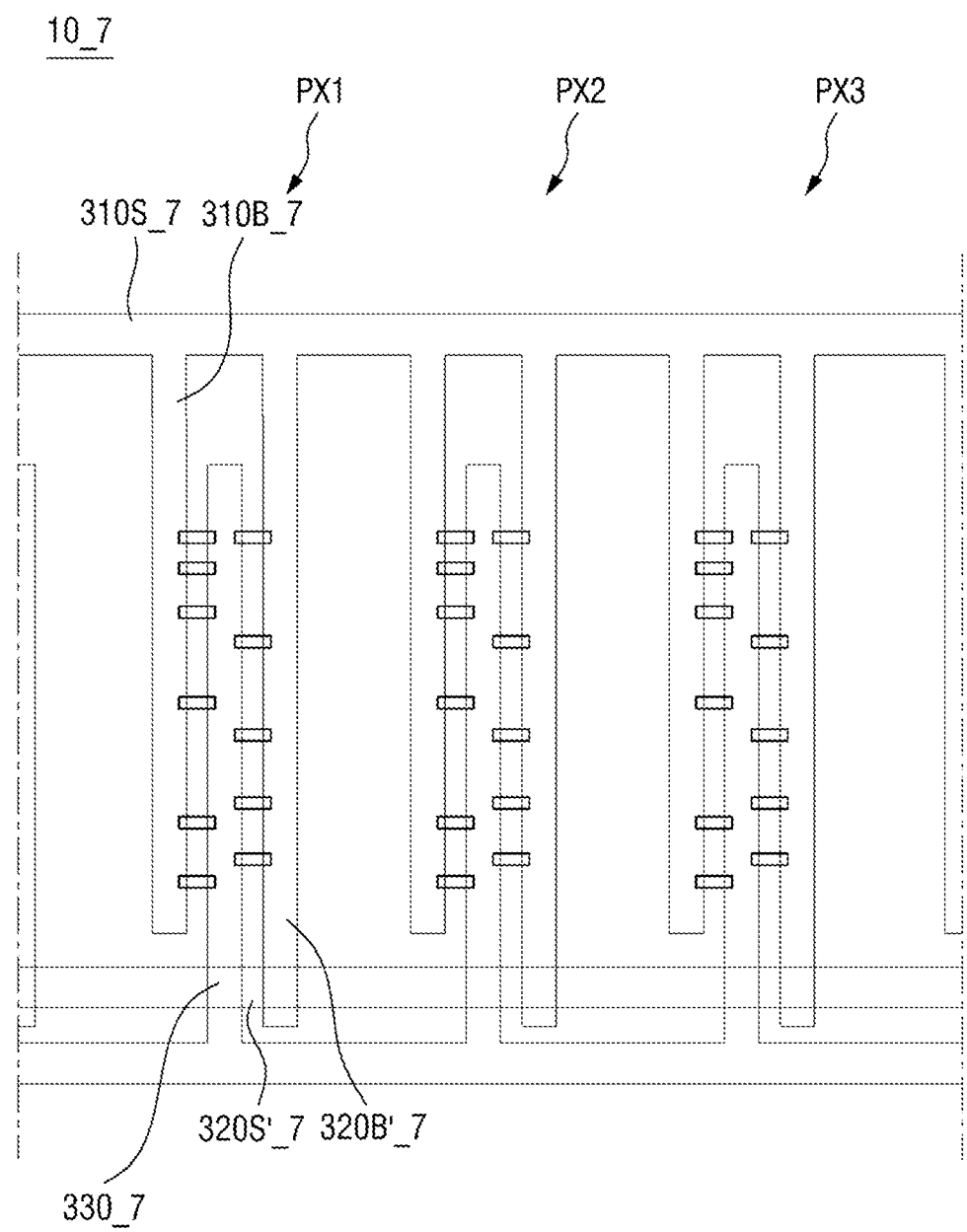
Figure 23:
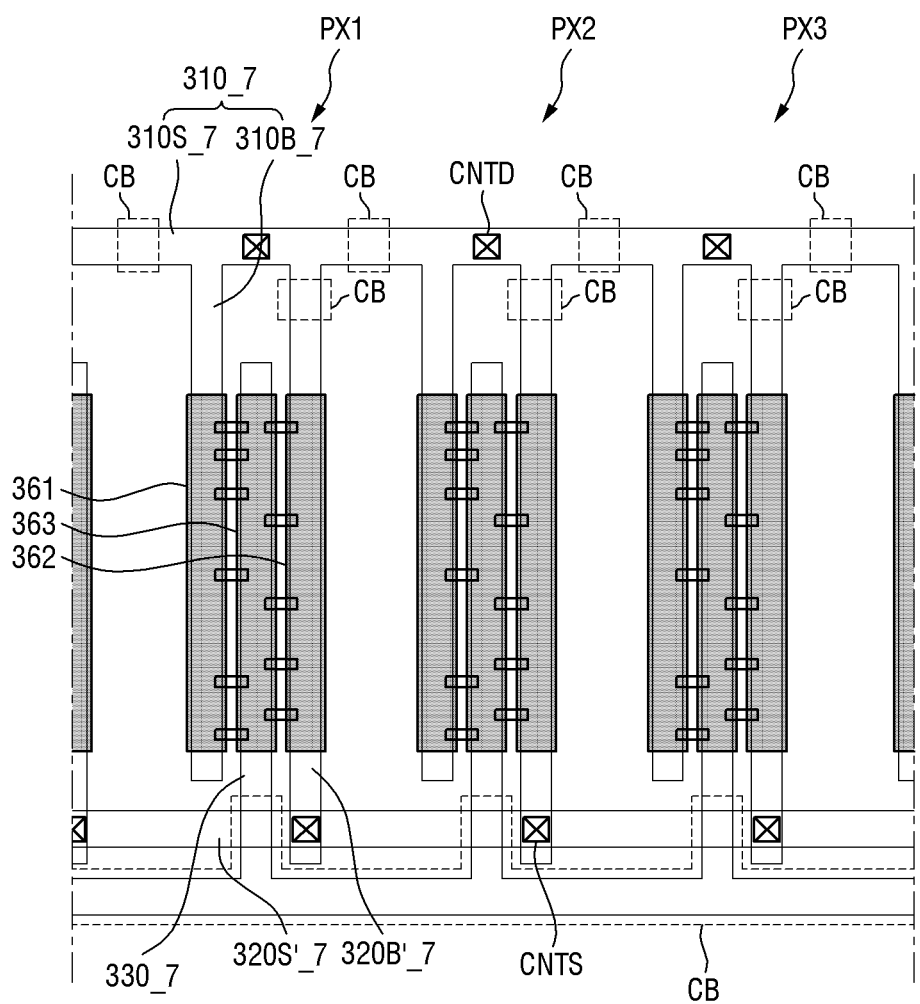

FIGS. 21 to 23 are plan views for illustrating a method of fabricating the display device of FIG. 20.

Referring to FIG. 21, the first electrode stem 310S_7, the first electrode branch 310B_7, the second electrode stem 320S_7, the third electrode 330_7, the second electrode branch 320B'_7 and the second electrode line 320S'_7 are formed on the insulating substrate layer 300.

The first electrode stem 310S_7 and the first electrode branch 310B_7 are identical to those described above; and, therefore, the redundant description will be omitted.

The third electrode 330_7 branches off from the second electrode stem 320S_7 to be extended in the second direction D2 and is separated from the first electrode stem 310S_7. The third electrode 330_7 is spaced apart from the first electrode branch 310B_7, and they are extended in the opposite directions to each other in the second direction D2.

The second electrode branch 320B'_7 branches off from the first electrode stem 310S_7 to be extended in the second direction D2 and be spaced apart from the first electrode branch 310B_7. The second electrode branch 320B'_7 may be extended in the same direction as the first electrode branch 310B_7. The end of the second electrode branch 320B'_7 may protrude more than the end of the first electrode branch 310B_7 toward the second electrode stem 320S_7. Because the second electrode branch 320B'_7 is electrically connected to the second electrode line 320S'_7 through the second electrode contact hole CNTS via a process to be described later, it may cover the second electrode line 320S'_7 when viewed from the top.

The second electrode line 320S'_7 is extended in the first direction D1 and is disposed between the first electrode stem 310S_7 and the second electrode stem 320S_7. The second electrode line 320S'_7 may be disposed in a line layer different from the first electrode stem 310S_7 and the second electrode stem 320S_7 and may be electrically connected through a second electrode contact hole CNTS to be described below.

Subsequently, referring to FIG. 22, one or more light-emitting elements 350 are aligned between the first electrode branch 310B_7, the third electrode 330_7 and the second electrode branch 320B'_7. To align the light-emitting elements 350, AC power is applied to the first electrode stem 310S_7 and the second electrode stem 320S_7 to form a capacitance induced by an electric field between the electrodes. The light-emitting elements 350 may be aligned as described above.

Subsequently, referring to FIG. 23, contact electrodes 360 are formed on the first electrode branch 310B_7, the third electrode 330_7 and the second electrode branch 320B_7 to bring into contact with the light-emitting elements 350. The above-described elements may be further formed on the contact electrodes 360. The detailed description thereon will be omitted.

Finally, as shown in FIG. 23, the first electrode stem 310S_7, the second electrode branch 320B'_7, the third electrode 330_7 and the second electrode stem 320S_7 are electrically separated at the cutting portions CB. Then, the first electrode stem 310S_7 may be electrically connected to the first thin-film transistor 120 through the first electrode contact hole CNTD, and the second electrode line 320S'_7 may be electrically connected to the second electrode branch 320B'_7 through the second electrode contact hole CNTS. In addition, the second electrode branch 320B'_7 may be electrically separated from the first electrode stem 310S_7 and may be spaced apart from the second electrode fragment 320G'_7. The third electrode 330_3 may be electrically separated from the second electrode stem 320S_7.

Accordingly, a current may flow between the first electrode branch 310B_7 and the second electrode branch 320B'_7. The light-emitting elements 350 disposed between the first electrode branch 310B_7 and the third electrode 330_7 and between the third electrode 330_7 and the second electrode branch 320B'_7 may be connected in series.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

The invention claimed is:

1. A display device comprising:
    a first electrode stem and a second electrode stem extended in a first direction and spaced from each other;
    a first electrode branch branching off from the first electrode stem and extended in a second direction;
    a second electrode branch branching off from the second electrode stem and extended in the second direction;
    a third electrode between the first electrode branch and the second electrode branch; and
    one or more light-emitting elements between the first electrode branch and the third electrode and between the third electrode and the second electrode branch,
    wherein the third electrode is extended in the second direction, and both ends of the third electrode in the second direction are spaced from the first electrode stem and from the second electrode stem, respectively.

2. The display device of claim 1,
    wherein the first electrode branch is extended opposite to the second electrode branch in the second direction.

3. The display device of claim 2,
    wherein the light-emitting elements comprises: a first light-emitting element between the first electrode branch and the third electrode; and
    a second light-emitting element between the third electrode and the second electrode branch,
    wherein the first light-emitting element and the second light-emitting element are connected in series between the first electrode branch and the second electrode branch.

4. The display device of claim 3,
    wherein a first end of the first light-emitting element is connected to the first electrode branch and a second end of the first light-emitting element is connected to the third electrode,
    wherein the first end or the second end of the first light-emitting element comprises a p-type semiconductor layer and the second end or the first end of the first light-emitting element comprises an n-type semiconductor layer, and
    wherein the first light-emitting element comprises an active layer between the p-type semiconductor layer and the n-type semiconductor layer.

5. The display device of claim 1,
    wherein the display device comprises a plurality of first electrode branches branching off from the first electrode stem,
    and the second electrode branch is between the plurality of first electrode branches.

6. The display device of claim 5,
    wherein the third electrode is at least between the second electrode branch and the first electrode branch on one side of the second electrode branch, and between the second electrode branch and the first electrode branch on an opposite side of the second electrode branch.

7. The display device of claim 6,
    wherein the display device comprises two or more third electrodes, and wherein the light-emitting elements are between adjacent ones of the third electrodes.

8. The display device of claim 7,
    wherein the light-emitting elements comprises: a third light-emitting element electrically connected on the one side of the second electrode branch; and a fourth light-emitting element electrically connected on the opposite side of the second electrode branch, wherein the third light-emitting element and the fourth light-emitting element are connected in parallel between the one side and the opposite side of the second electrode branch.

9. The display device of claim 8, wherein the plurality of first electrode branches and the two or more third electrodes are symmetrically arranged with respect to the second electrode branch.

10. The display device of claim 1, further comprising:

a third electrode fragment protruding from the first electrode stem and the second electrode stem in the second direction.

11. The display device of claim 10, wherein the third electrode comprises: two or more third electrode branches spaced from each other between the first electrode branch and the second electrode branch, and wherein the light-emitting elements comprise: a fifth light-emitting element having an end electrically connected to the first electrode stem and another end connected to the third electrode branch;

a sixth light-emitting element having both ends electrically connected to the two or more third electrode branches; and a seventh light-emitting element having one end electrically connected to the third electrode branch and another end connected to the second electrode branch, wherein the fifth light-emitting element, the sixth light-emitting element and the seventh light-emitting element are connected in series between the first electrode branch and the second electrode branch.

12. A display device comprising:

a first electrode connected to a thin-film transistor;

a second electrode connected to a common power supply line;

a floating electrode extending in a first direction between the first electrode and the second electrode and spaced from the first electrode and the second electrode in the first direction and a second direction perpendicular to the first direction;

a first light-emitting diode having one end electrically connected to the first electrode and another end electrically connected to the floating electrode; and a second light-emitting diode having one end electrically connected to the floating electrode and another end electrically connected to the second electrode, wherein the first light-emitting diode and the second light-emitting diode are connected in series between the first electrode and the second electrode.

13. The display device of claim 12, wherein the first electrode, the second electrode and the floating electrode are extended in the first direction, and wherein the first light-emitting diode and the second light-emitting diode in series are extended in the second direction.

14. The display device of claim 13, wherein the first light-emitting diode and the second light-emitting diode each comprise a first conductivity-type semiconductor layer, an active layer, and a second conductivity-type semiconductor layer, wherein one of the first conductivity-type semiconductor layer and the second conductivity-type semiconductor layer is of p-type and other one is of n-type, wherein the first conductivity-type semiconductor layer of the first light-emitting diode is electrically connected to the first electrode, wherein the second conductivity-type semiconductor layer of the first light-emitting diode is electrically connected to the floating electrode, the first conductivity-type semiconductor layer of the second light-emitting diode is electrically connected to the floating electrode, and the second conductivity-type semiconductor layer of the second light-emitting diode is electrically connected to the second electrode.

15. The display device of claim 14, wherein a length of the first light-emitting diode and the second light-emitting diode ranges from 3 to 6 μm.

\* \* \* \* \*